(12) United States Patent
Kim et al.

(10) Patent No.: US 11,171,082 B2
(45) Date of Patent: Nov. 9, 2021

(54) SEMICONDUCTOR PACKAGE

(71) Applicant: SAMSUNG ELECTRONICS CO., LTD., Suwon-si (KR)

(72) Inventors: Jihoon Kim, Suwon-si (KR); Mijin Park, Suwon-si (KR); Jinwon Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 79 days.

(21) Appl. No.: 16/661,345

(22) Filed: Oct. 23, 2019

(65) Prior Publication Data
US 2020/0144173 A1 May 7, 2020

(30) Foreign Application Priority Data
Nov. 6, 2018 (KR) .......................... 10-2018-0135129

(51) Int. Cl.
*H01L 23/495* (2006.01)
*H01L 23/498* (2006.01)
(Continued)

(52) U.S. Cl.
CPC ........ *H01L 23/49838* (2013.01); *H01L 23/13* (2013.01); *H01L 23/3128* (2013.01);
(Continued)

(58) Field of Classification Search
CPC ......... H01L 23/49822; H01L 23/49833; H01L 23/49838; H01L 23/13; H01L 23/3128;
(Continued)

(56) References Cited

U.S. PATENT DOCUMENTS 8,344,490 B2 * 1/2013 Aiba ..................... H01L 25/18
257/686
9,087,832 B2 * 7/2015 Huang ............. H01L 23/49822
(Continued)

FOREIGN PATENT DOCUMENTS

| JP | 2004-335657 A | 11/2004 |
|---|---|---|
| JP | 2008-10621 A | 1/2008 |
| JP | 2018-152437 A | 9/2018 |
| KR | 10-2017-0112907 A | 10/2017 |
| KR | 10-2003390 B1 | 7/2019 |

OTHER PUBLICATIONS

Communication dated Jun. 29, 2020, issued by the Korean Intellectual Property Office in corresponding Korean Application No. 10-2018-0135129.

*Primary Examiner* — Nitin Parekh
(74) *Attorney, Agent, or Firm* — Sughrue Mion, PLLC

(57) ABSTRACT

A semiconductor package includes: a connection structure including a plurality of insulating layers and redistribution layers respectively disposed on the plurality of insulating layers; a semiconductor chip having connection pads connected to the redistribution layer; an encapsulant encapsulating the semiconductor chip; first and second pads arranged on at least one surface of the connection structure and each having a plurality of through-holes; a surface mount component disposed on the at least one surface of the connection structure and including first and second external electrodes positioned, respectively, in regions of the first and second pads; first and second connection vias arranged in the plurality of insulating layers and connecting the first and second pads to the redistribution layers, respectively; and first and second connection metals connecting the first and second pads and the first and second external electrodes to each other, respectively.

15 Claims, 14 Drawing Sheets

(51) Int. Cl.
*H01L 23/31* (2006.01)
*H01L 25/16* (2006.01)
*H01L 23/13* (2006.01)
*H01L 23/00* (2006.01)

(52) U.S. Cl.
CPC .. *H01L 23/49816* (2013.01); *H01L 23/49822* (2013.01); *H01L 23/49833* (2013.01); *H01L 24/24* (2013.01); *H01L 25/16* (2013.01); *H01L 2224/24265* (2013.01); *H01L 2924/19102* (2013.01)

(58) Field of Classification Search
CPC ............... H01L 24/24; H01L 25/16; H01L 2224/24265; H01L 2924/19102
USPC ............................ 257/668, 724, 773, 786
See application file for complete search history.

(56) References Cited

U.S. PATENT DOCUMENTS

| | | | |
|---|---|---|---|
| 2003/0015342 A1* | 1/2003 | Sakamoto | H01L 23/49816 174/250 |
| 2008/0003846 A1 | 1/2008 | Miyagawa | |
| 2016/0071779 A1* | 3/2016 | Chen | H01L 21/76895 257/787 |
| 2017/0032977 A1* | 2/2017 | Chen | H01L 21/56 |
| 2017/0084555 A1* | 3/2017 | Yu | H01L 24/94 |
| 2017/0287853 A1* | 10/2017 | Kim | H01L 23/49822 |
| 2017/0365566 A1 | 12/2017 | Lee et al. | |
| 2019/0006283 A1* | 1/2019 | Wang | H01L 21/568 |
| 2019/0221917 A1* | 7/2019 | Kim | H01Q 9/0407 |

\* cited by examiner

SEMICONDUCTOR PACKAGE

CROSS-REFERENCE TO RELATED APPLICATION(S)

This application claims the benefit of priority to Korean Patent Application No. 10-2018-0135129 filed on Nov. 6, 2018 in the Korean Intellectual Property Office, the disclosure of which is incorporated herein by reference in its entirety.

TECHNICAL FIELD

The present disclosure relates to a semiconductor package.

BACKGROUND

A significant recent trend in the development of technology related to semiconductor chips has been reductions in the size of semiconductor chips. Therefore, in the field of package technology, in accordance with a rapid increase in demand for small-sized semiconductor chips, or the like, the implementation of a semiconductor package, having a compact size while including a plurality of pins, has been demanded. One type of package technology suggested to satisfy the technical demand as described above may be a fan-out semiconductor package.

A semiconductor package may include various surface mount components such as capacitors in order to improve electrical performance (for example, noise and/or impedance reduction). In these surface mount components, a crack occurs in an electrical connection metal (for example, a solder) due to thermal and mechanical impact or stress is concentrated on an outer side of a pad to cause a reliability defect (for example, cracking, peeling, or the like).

SUMMARY

An aspect of the present disclosure may provide a semiconductor package in which a problem due to mounting of a surface mount component may be solved.

According to an aspect of the present disclosure, a semiconductor package may include: a connection structure including a first surface and a second surface opposing each other and including a plurality of insulating layers and redistribution layers respectively disposed on the plurality of insulating layers; a semiconductor chip disposed on the first surface of the connection structure and having connection pads connected to the redistribution layer; an encapsulant disposed on the first surface of the connection structure and encapsulating the semiconductor chip; first and second pads arranged on at least one surface of the connection structure and each having a plurality of through-holes; a surface mount component disposed on the at least one surface of the connection structure and including first and second external electrodes positioned, respectively, in one regions of the first and second pads; first and second connection vias in the plurality of insulating layers and connecting the first and second pads to the redistribution layers, respectively; and first and second connection metals connecting the first and second pads and the first and second external electrodes to each other, respectively.

According to another aspect of the present disclosure, a semiconductor package may include: a connection structure including a first surface and a second surface opposing each other and including a plurality of insulating layers and redistribution layers respectively disposed on the plurality of insulating layers; a semiconductor chip disposed on the first surface of the connection structure and having connection pads connected to the redistribution layer; an encapsulant disposed on the first surface of the connection structure and encapsulating the semiconductor chip; first and second pads adjacent to each other and arranged on the second surface of the connection structure, each having a plurality of through-holes; and first and second connection vias arranged in the plurality of insulating layers and connecting the first and second pads to the redistribution layers, respectively, wherein the first and second pads respectively include first regions corresponding to portions adjacent to each other and second regions corresponding to remaining portions except the first regions, and the first and second connection vias are positioned to overlap with the first regions of the first and second pads, respectively, from a plan view perpendicular to a stacking direction.

According to another aspect of the present disclosure, a board assembly may include: a circuit board including a plurality of insulating layers and wiring circuits respectively disposed on the plurality of insulating layers; first and second pads arranged on an upper surface of the circuit board and each having a plurality of through-holes; a surface mount component disposed on the upper surface of the circuit board and including first and second external electrodes positioned, respectively, in one regions of the first and second pads; first and second connection vias disposed in the plurality of insulating layers, arranged in regions overlapping the first and second external electrodes, respectively, from a plan view perpendicular to a stacking direction, and respectively connecting the first and second pads to the wiring circuits; and first and second connection metals connecting the first and second pads and the first and second external electrodes to each other, respectively.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments in the present disclosure will be described with reference to the accompanying drawings. In the accompanying drawings, shapes, sizes, and the like, of components may be exaggerated or shortened for clarity.

Herein, a lower side, a lower portion, a lower surface, and the like, are used to refer to a downward direction in relation to cross sections of the drawings for convenience, while an upper side, an upper portion, an upper surface, and the like, are used to refer to an opposite direction to the downward direction. However, these directions are defined for convenience of explanation, and the claims are not particularly limited by the directions defined as described above, and concepts of upper and lower portions may be exchanged with each other.

The meaning of a "connection" of a component to another component in the description conceptually includes an indirect connection through an adhesive layer as well as a direct connection between two components. In addition, "electrically connected" conceptually includes a physical connection and a physical disconnection. It can be understood that when an element is referred to with terms such as "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with one another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

Electronic Device

Figure 1:
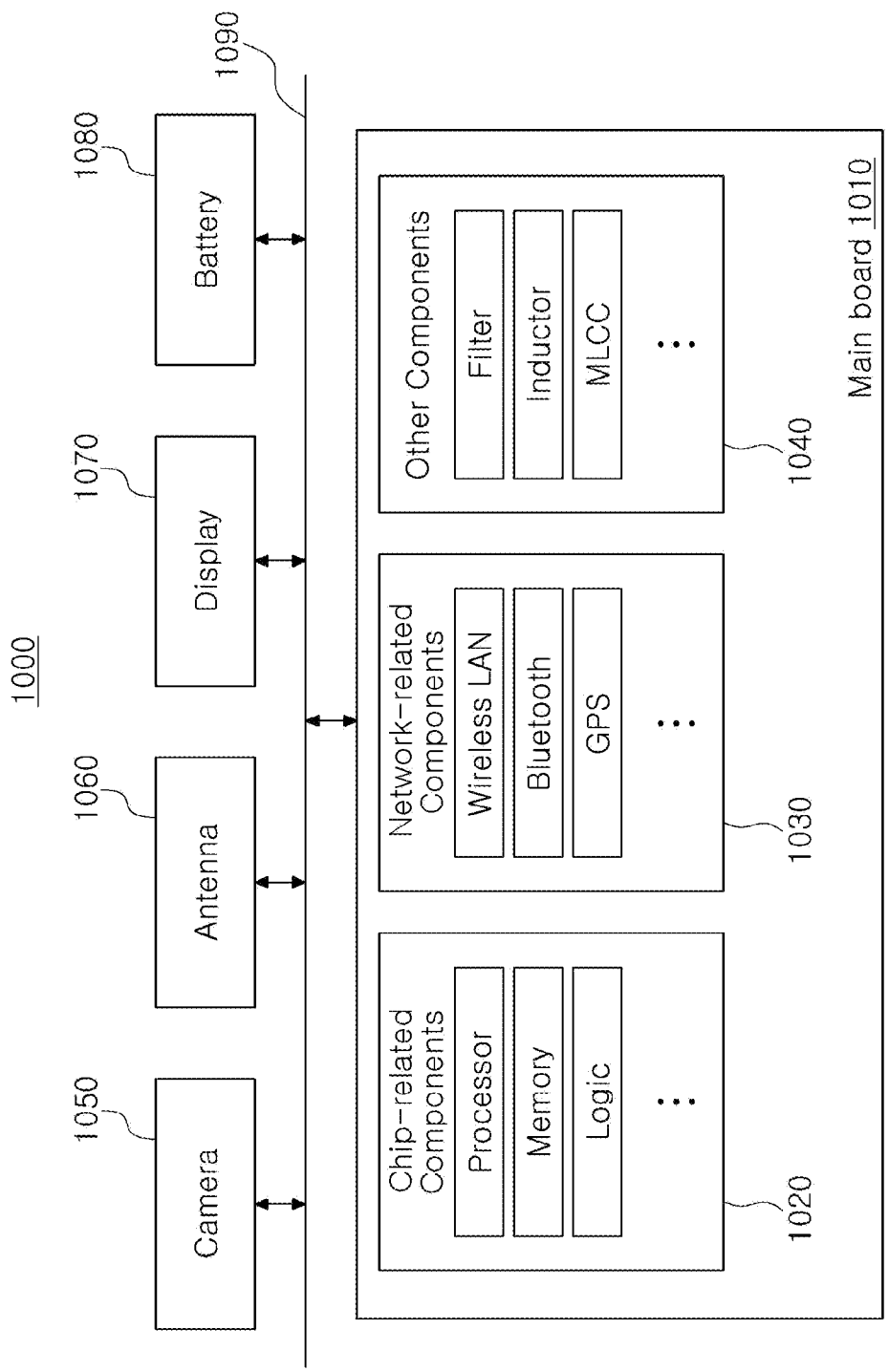
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
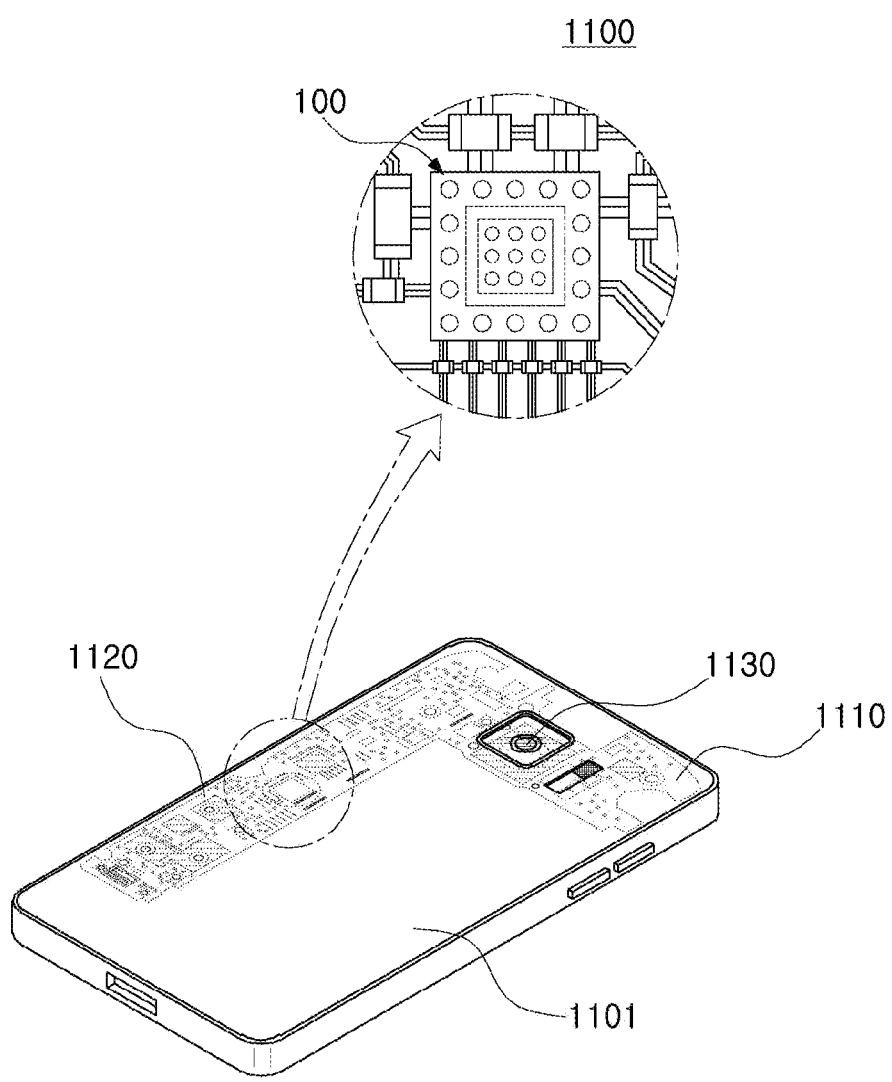
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various electronic components 1120 may be physically or electrically connected to the motherboard 1110. In addition, other components that may or may not be physically or electrically connected to the mainboard 1010, such as a camera module 1130, may be accommodated in the body 1101. Some of the electronic components 1120 may be the chip related components, and the semiconductor package 100 may be, for example, an application processor among the chip related components, but is not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a semiconductor finished product in oneself, and may be damaged due to external physical or chemical impact. Therefore, the semiconductor chip is not used in oneself, and is packaged and is used in an electronic device, or the like, in a package state.

The reason why semiconductor packaging is required is that there is a difference in a circuit width between the semiconductor chip and a mainboard of the electronic device in terms of electrical connection. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the accompanying drawings.

Fan-In Semiconductor Package

Figure 3B:
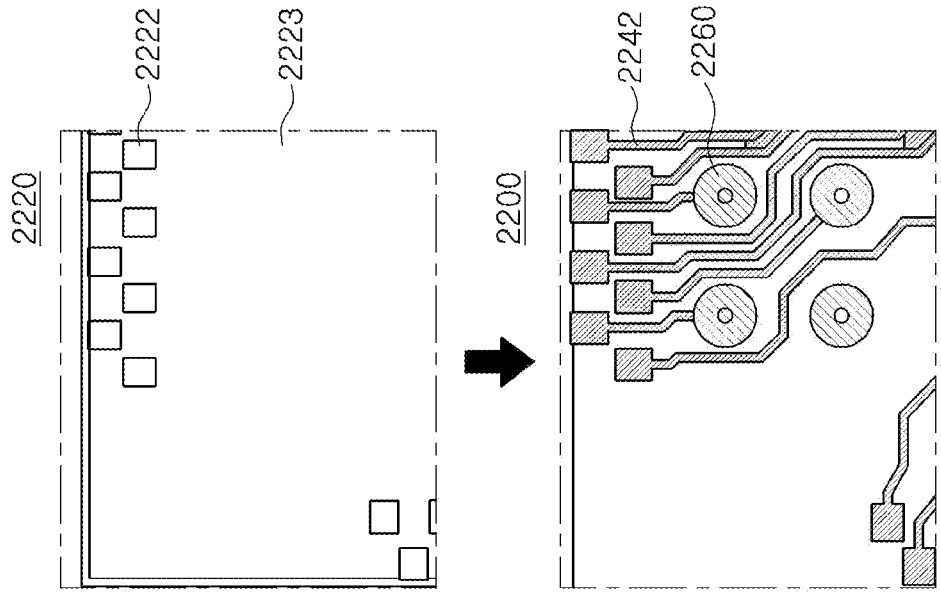
FIGS. 3A and 3B are schematic cross-sectional views illustrating states of a fan-in semiconductor package before and after being packaged.
Figure 3A:
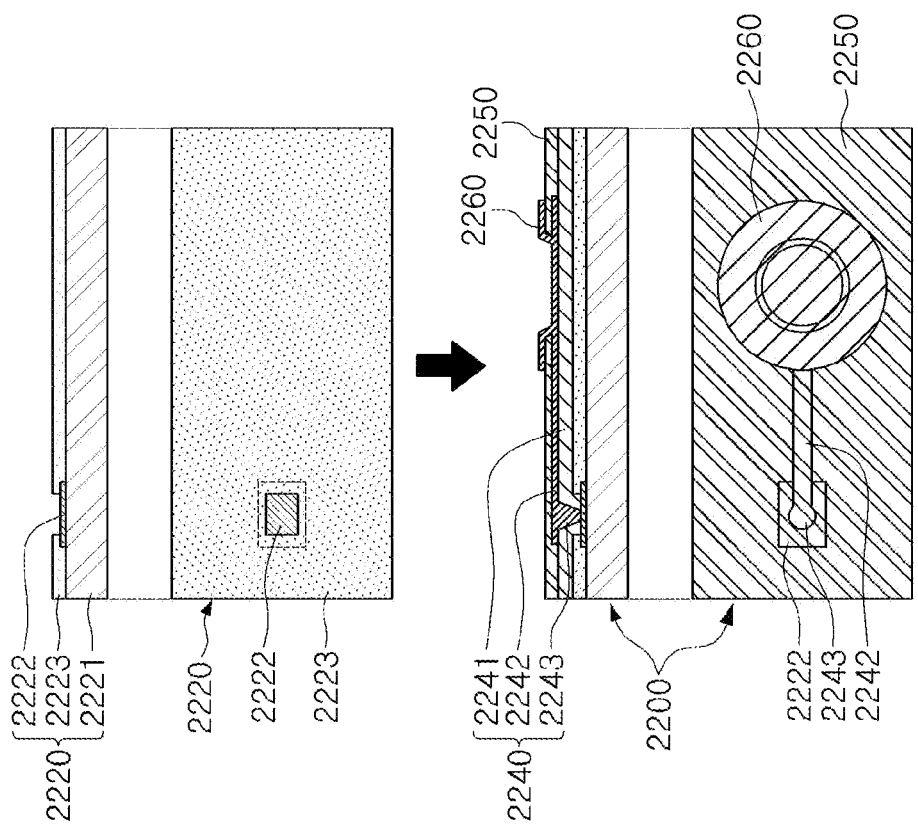
Figure 4:
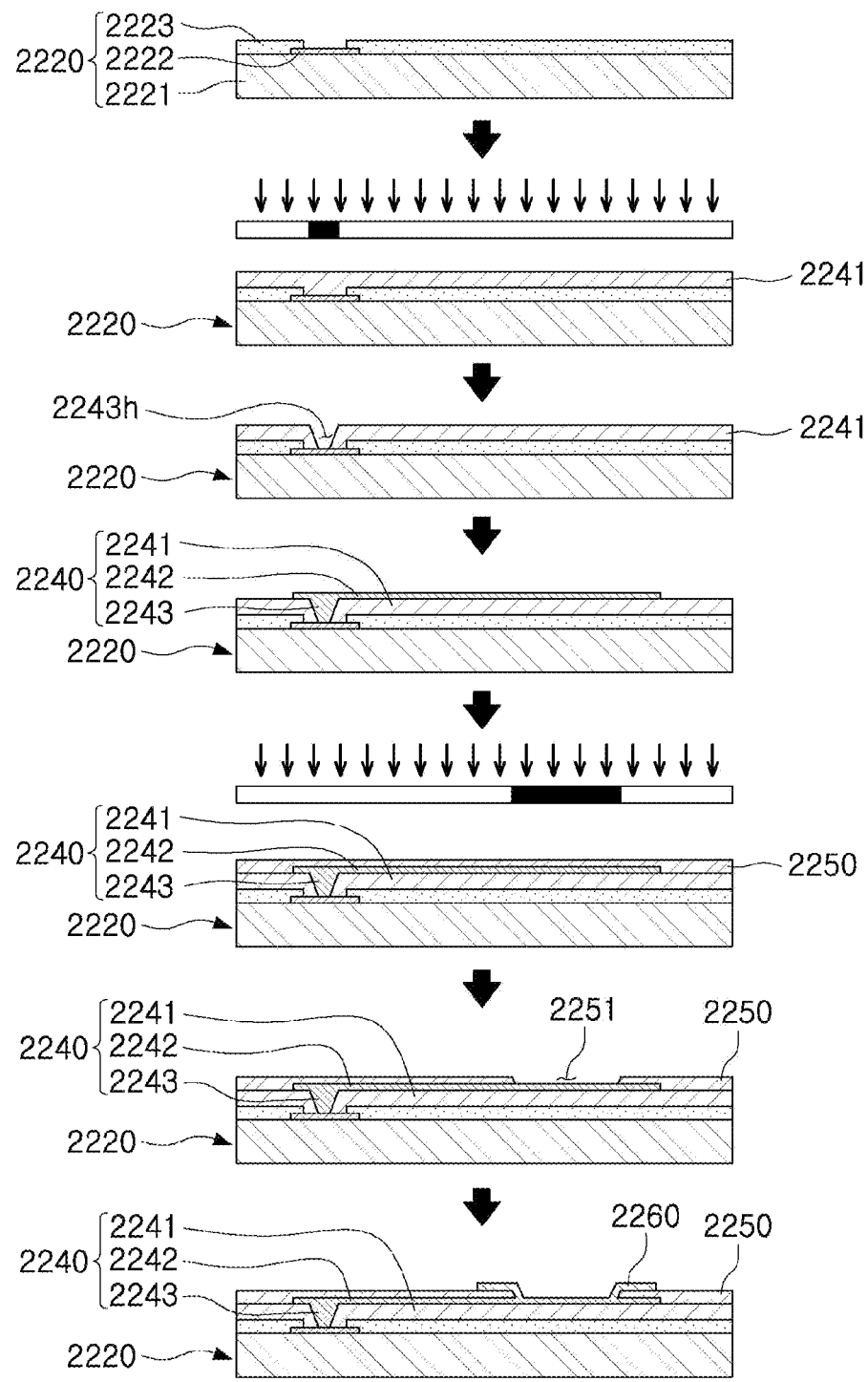
FIG. 4 is a schematic cross-sectional view illustrating a packaging process of a fan-in semiconductor package.

FIGS. 3A and 3B are schematic cross-sectional views illustrating states of a fan-in semiconductor package before and after being packaged, and FIG. 4 is schematic cross-sectional views illustrating a packaging process of a fan-in semiconductor package.

Referring to FIGS. 3 and 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide layer, a nitride layer, or the like, formed on one surface of the body 2221 and covering at least portions of the connection pads 2222. Since the connection pads 2222 may be significantly small, it may be difficult to mount the integrated circuit (IC) on an intermediate level printed circuit board (PCB) as well as on the mainboard of the electronic device, or the like.

Therefore, a connection structure 2240 may be formed depending on a size of the semiconductor chip 2220 on the semiconductor chip 2220 in order to redistribute the connection pads 2222. The connection structure 2240 may be formed by forming an insulating layer 2241 on the semiconductor chip 2220 using an insulating material such as a photoimagable dielectric (PID) resin, forming via holes 2243h opening the connection pads 2222, and then forming wiring patterns 2242 and vias 2243. Then, a passivation layer 2250 protecting the connection structure 2240 may be formed, an opening 2251 may be formed, and an underbump metal layer 2260, or the like, may be formed. That is, a fan-in semiconductor package 2200 including, for example, the semiconductor chip 2220, the connection structure 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a small size. In addition, due to the disadvantage described above, the fan-in semiconductor package may not be directly mounted and used on the mainboard of the electronic device. The reason is that even in the case in which a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the mainboard of the electronic device.

Figure 5:
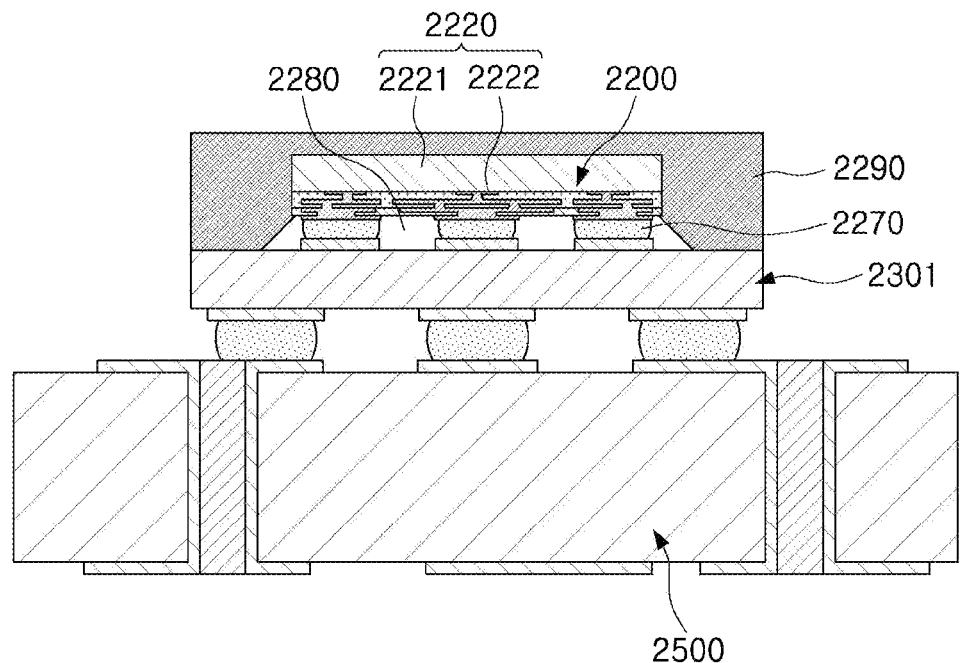
FIG. 5 is a schematic cross-sectional view illustrating a case in which a fan-in semiconductor package is mounted on an interposer substrate and is ultimately mounted on a mainboard of an electronic device.
Figure 6:
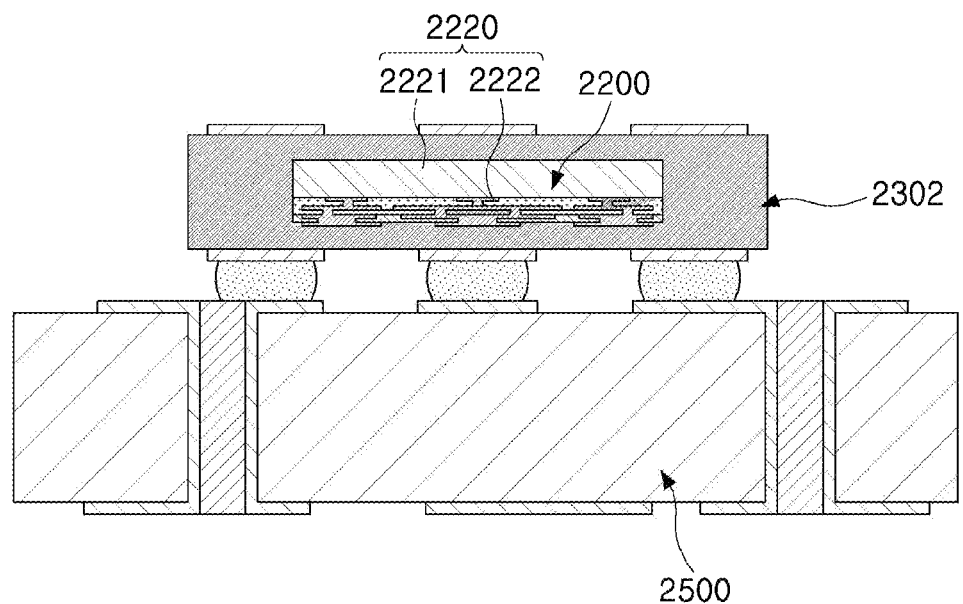
FIG. 6 is a schematic cross-sectional view illustrating a case in which a fan-in semiconductor package is embedded in an interposer substrate and is ultimately mounted on a mainboard of an electronic device.

FIG. 5 is a schematic cross-sectional view illustrating a case in which a fan-in semiconductor package is mounted on an interposer substrate and is ultimately mounted on a mainboard of an electronic device, and FIG. 6 is a schematic cross-sectional view illustrating a case in which a fan-in semiconductor package is embedded in an interposer substrate and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed once more through an interposer substrate 2301, and the fan-in semiconductor package 2200 may be ultimately mounted on a mainboard 2500 of an electronic device in a state in which it is mounted on the interposer substrate 2301. In this case, low melting point metal or alloy balls 2270, and the like, may be fixed by an underfill resin 2280, or the like, and an outer side of the semiconductor chip 2220 may be covered with an encapsulant 2290, or the like. Alternatively, a fan-in semiconductor package 2200 may be embedded in a separate interposer substrate 2302, connection pads 2222, that is, I/O terminals, of a semiconductor chip 2220 may be redistributed once more by the interposer substrate 2302 in a state in which the fan-in semiconductor package 2200 is embedded in the interposer substrate 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate interposer substrate and be then mounted on the mainboard of the electronic device through a packaging process or may be mounted and used on the mainboard of the electronic device in a state in which it is embedded in the interposer substrate.

Fan-Out Semiconductor Package

Figure 7:
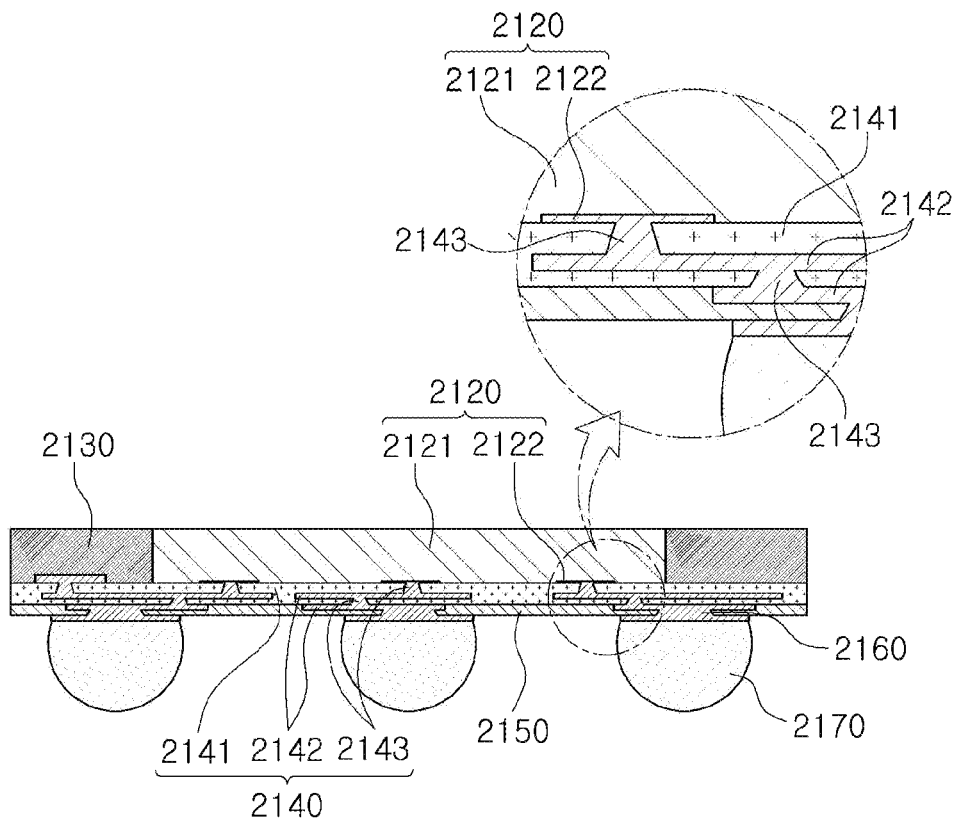
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection structure 2140. In this case, a passivation layer 2150 may further be formed on the connection structure 2140, and an underbump metal layer 2160 may further be formed in openings of the passivation layer 2150. Low melting point metal or alloy balls 2170 may further be formed on the underbump metal layer 2160. The semiconductor chip 2120 may be an integrated circuit (IC) including a body 2121, the connection pads 2122, a passivation layer (not illustrated), and the like. The connection structure 2140 may include an insulating layer 2141, redistribution layers 2142 formed on the insulating layer 2141, and vias 2143 electrically connecting the connection pads 2122 and the redistribution layers 2142 to each other.

In the present manufacturing process, the connection structure 2140 may be formed after the encapsulant 2130 is formed outside the semiconductor chip 2120. In this case, the connection structure 2140 may be formed after the semiconductor chip 2120 is encapsulated, and the vias 2143 connected to the redistribution layers may thus have a width that becomes small as they become close to the semiconductor chip (see an enlarged region).

As described above, the fan-out semiconductor package may have a form in which I/O terminals of the semiconductor chip are redistributed and disposed outwardly of the semiconductor chip through the connection structure formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection structure formed on the semiconductor chip as described above. Therefore, even in the case in which a size of the semiconductor chip is decreased, a standardized ball layout may be used in the fan-out semiconductor package as it is, such that the fan-out semiconductor package may be mounted on the mainboard of the electronic device without using a separate interposer substrate, as described below.

Figure 8:
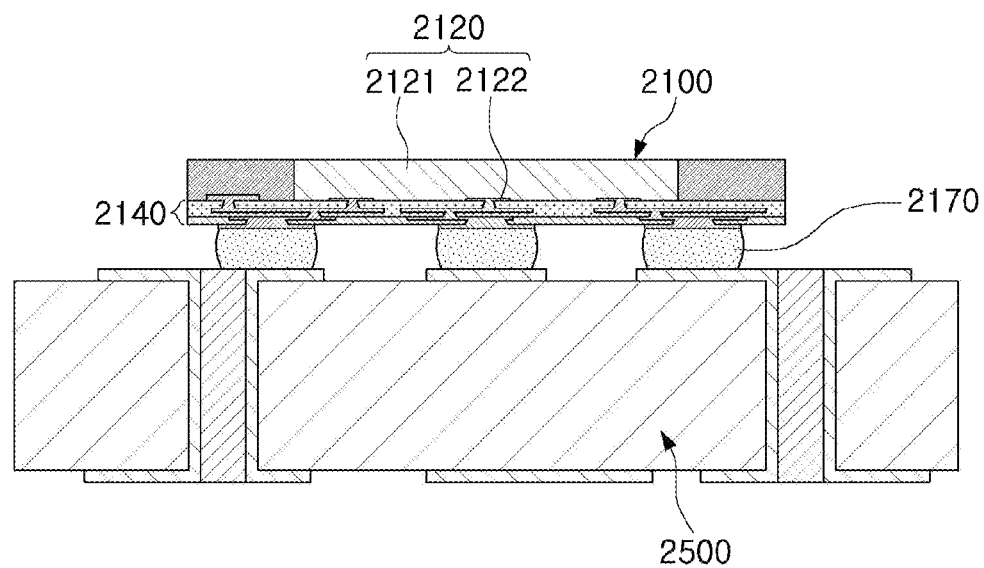
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through low melting point metal or alloy balls 2170, or the like. That is, as described above, the fan-out semiconductor package 2100 includes the connection structure 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate interposer substrate, or the like.

As described above, since the fan-out semiconductor package may be mounted on the mainboard of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out electronic component package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

Figure 9:
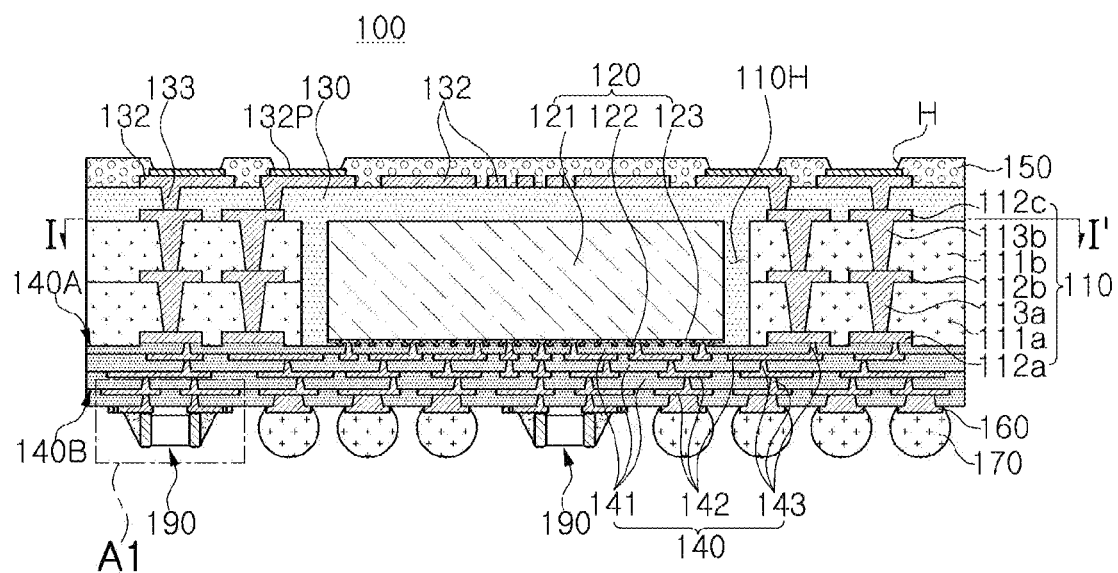
FIG. 9 is a schematic cross-sectional view illustrating a semiconductor package according to an exemplary embodiment in the present disclosure.
Figure 10:
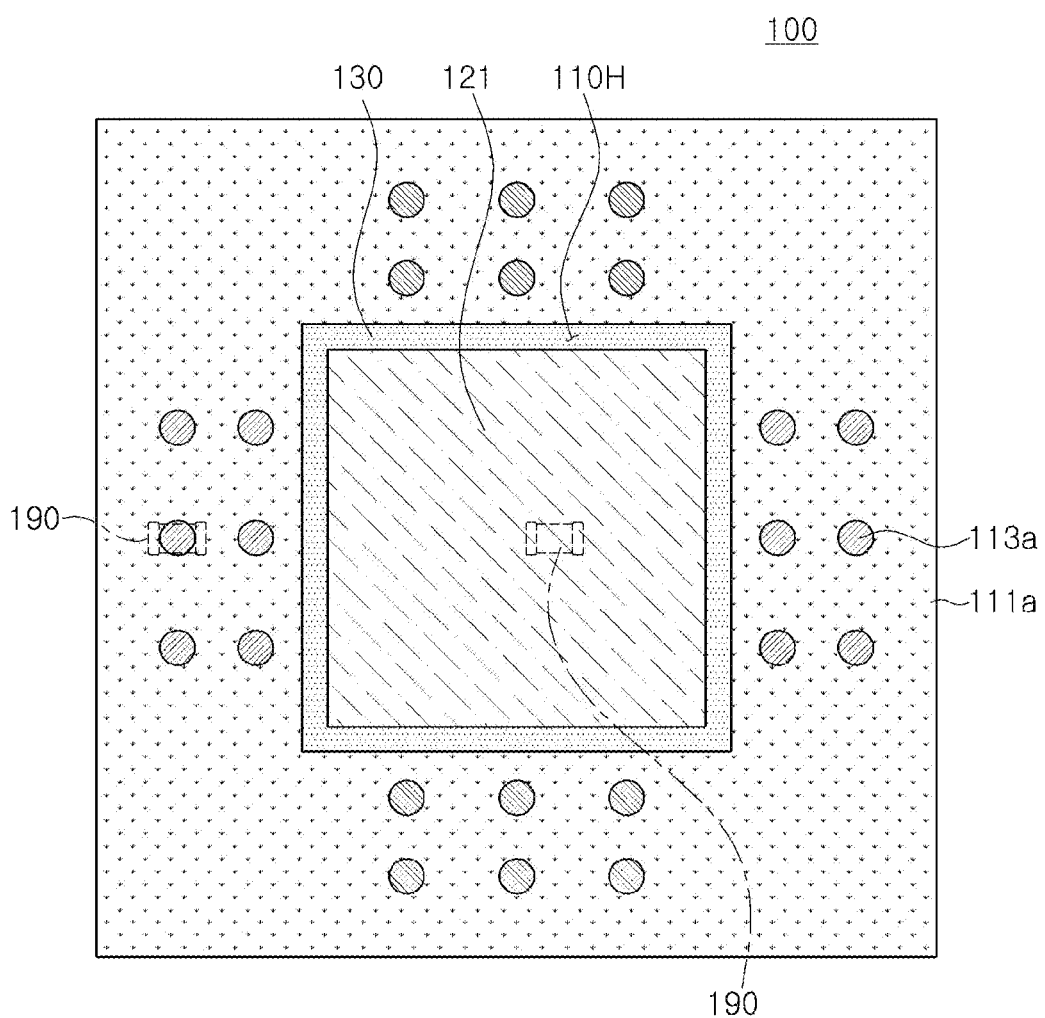
FIG. 10 is a plan view taken along line I-I' of the semiconductor package of FIG. 9.

FIG. 9 is a schematic cross-sectional view illustrating a semiconductor package according to an exemplary embodiment in the present disclosure, and FIG. 10 is a plan view taken along line I-I' of the semiconductor package of FIG. 9.

Referring to FIGS. 9 and 10, a semiconductor package 100 according to the present exemplary embodiment may include a connection structure 140 having a first surface 140A and a second surface 140B opposing each other, a semiconductor chip 120 disposed on the first surface 140A of the connection structure 140, and an encapsulant 130 disposed on the first surface 140A of the connection structure 140 and encapsulating the semiconductor chip 120.

The semiconductor package 100 may further include a frame 110, a wiring pattern layer 132, wiring vias 133, a passivation layer 150, a surface mount component 190, underbump metals 160, and external connection metals 170.

The connection structure 140 may include three redistribution layers 142 implemented on a plurality of (for example, fourth) insulating layers 141, and connection pads 122 of the semiconductor chip 120 disposed on the first surface 140A of the connection structure 140 may be connected to the redistribution layers 142. The frame 110 may be disposed on the first surface 140A of the connection structure 140, and the semiconductor chip 120 may be accommodated in a cavity 110H of the frame. The frame 110 may have a wiring structure including three wiring layers 112a, 112b, and 112c and wiring vias 113a and 113b connecting the three wiring layers 112a, 112b, and 112c to each other. The wiring structure of the frame 110 may be connected to the redistribution layer 142 of the connection structure 140.

The surface mount component 190 may be mounted on the second surface 140A of the connection structure 140. The surface mount component 190 may include various types of surface mount components as well as passive components such as a capacitor and an inductor. In the present exemplary embodiment, a case in which the semiconductor package 100 includes two surface mount components 190 is exemplified, but the semiconductor package 100 may include at least one surface mount component, and in some exemplary embodiments (see FIG. 18), the surface mount component 190 may also be disposed on the first surface 140A of the connection structure 140.

Figure 11:
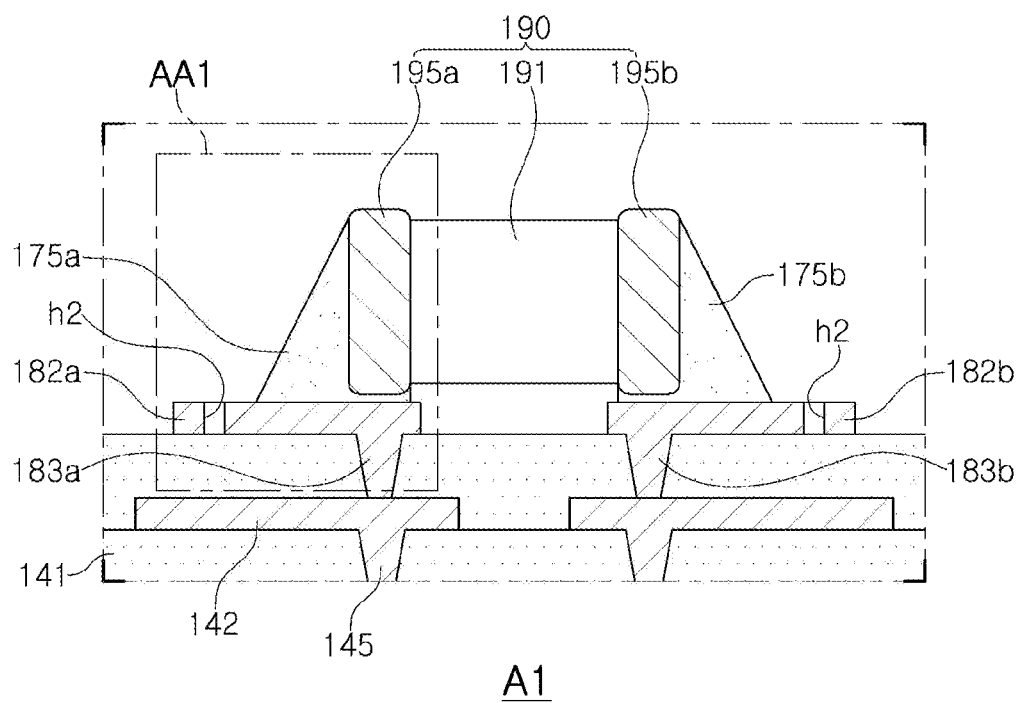
FIG. 11 is an enlarged cross-sectional view of region "A1" of the semiconductor package of FIG. 9.

FIG. 11 is an enlarged cross-sectional view of region "A1" of the semiconductor package of FIG. 9. Here, in the enlarged cross-sectional view of FIG. 11, region "A1" is illustrated in a state in which the top and the bottom are reversed in order to facilitate the understanding.

Referring to FIG. 11, the surface mount component 190 may include first and second external electrodes 195a and 195b for externally connecting an element body 191. First and second pads 182a and 182b for the surface mount component 190 may be formed on the insulating layer 141 of the connection structure 140. First and second connection vias 183a and 183b may be formed in the outermost insulating layer of the plurality of insulating layers 141, and the first and second pads 182a and 182b may be connected to the redistribution layer 142 of the connection structure 140 through the first and second connection vias 183a and 183b, respectively. The surface mount component 190 may be mounted on the first and second pads 182a and 182b so that the first and second external electrodes 195a and 195b are positioned on one regions of the first and second connection pads 182a and 182b, respectively. The first and second external electrodes 195a and 195b of the surface mount component 190 may be electrically or mechanically connected to the first and second pads 182a and 182b by first and second connection metals 175a and 175b, respectively. Each of the first and second connection metals 175a and 175b may include a low melting point metal, for example, a lower melting point metal such as tin (Sn)-aluminum (Al)-cupper (Cu).

Figure 12:
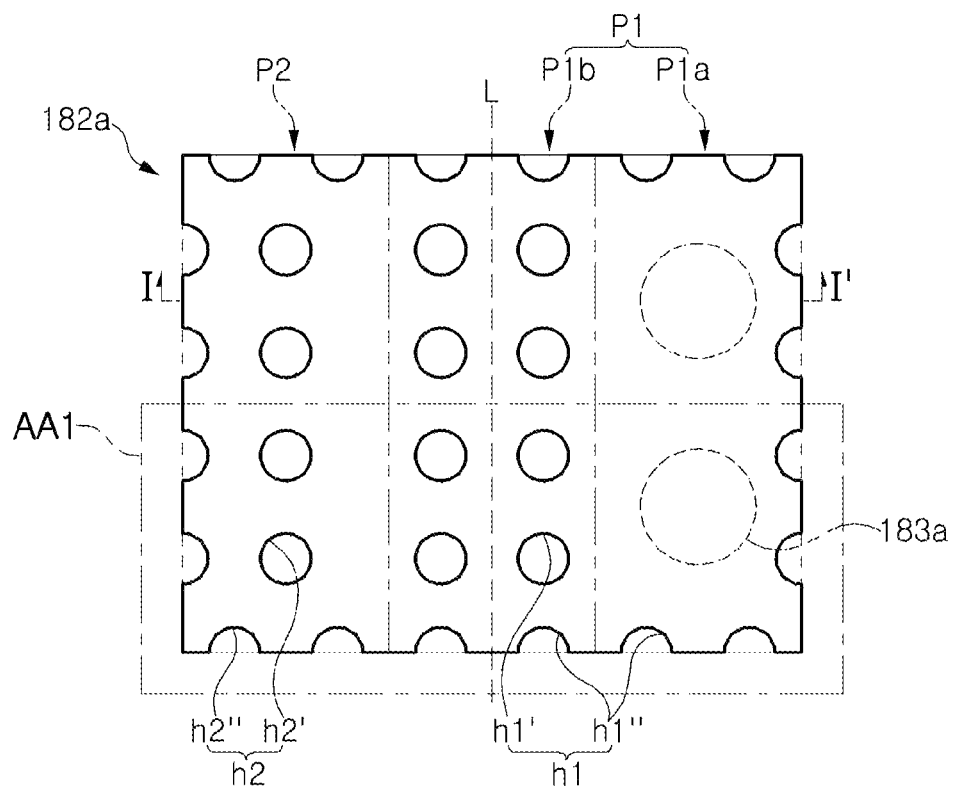
FIG. 12 is a plan view illustrating a pad for a surface mount component used in the semiconductor package of FIG. 9.
Figure 13:
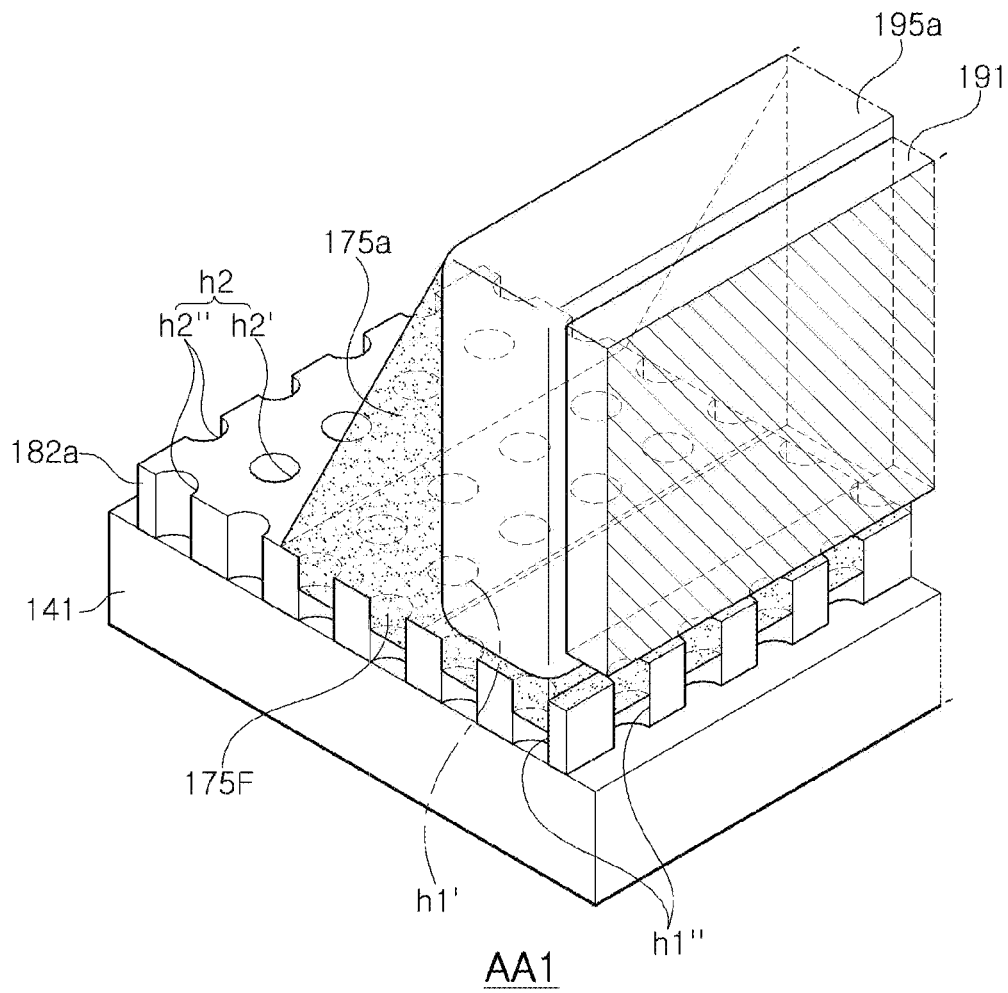
FIG. 13 is an enlarged perspective view of region "AA1" of the semiconductor package of FIG. 11.

FIG. 12 is a plan view of the first pad 182a used in the present exemplary embodiment, and FIG. 13 is an enlarged perspective view of region "AA1" of the semiconductor package of FIG. 11. Here, it may be understood that the second pad 182b has a structure corresponding to that of the first pad 182a.

Referring to FIG. 12, the first and second pads 182a and 182b used in the present exemplary embodiment may include a plurality of through-holes h1 and h2, respectively. The through-holes h1 and h2 used in the present exemplary embodiment may reduce volumes of the first and second pads 182a and 182b to reduce stress due to a difference in a coefficient of thermal expansion between the first and second pads 182a and 182b and the insulating layer 141. In detail, the plurality of through-holes h1 and h2 may provide different beneficial functions depending on positions thereof.

The first and second pads 182a and 182b may include first regions P1 covered with the first and second external electrodes 195a and 195b and the first and second connection metals 175a and 175b and second regions P2 corresponding to remaining portions except the first regions P1, respectively. The plurality of through-holes h1 and h2 may include first through-holes h1 positioned in the first regions P1 and second through-holes h2 positioned in the second regions P2.

As illustrated in FIG. 13, the first through holes h1 may have portions 175a and 175bF of which at least portions are filled with the first and second connection metals 175a and 175b, and the second through-holes h2 may maintain empty internal spaces.

The first through-holes h1 may be in contact with the first and second connection metals 175a and 175b in a reflow process, such that portions or the entirety of inner portions of the first through-holes h1 may be filled with first and second connection metals 175a and 175b. In this case, due to such a filling process, amounts of used first and second connection metals 175a and 175b, that is, volumes of the first and second connection metals 175a and 175b may be increased as compared with a case in which the first through-holes h1 do not exist, and large contact areas between the first and second connection metals 175a and 175b and the first and second pads 182a and 182b may be secured. Even though cracks occur in the first and second connection metals 175a and 175b, propagation paths of the cracks may be increased, such that the cracks are isolated, resulting in reduction in the possibility of an open defect.

In addition, the second through-holes h2 may maintain empty spaces connected to a surface of the insulating layer 141 without being in contact with the first and second connection metals 175a and 175b. Therefore, the second through-holes h2 may also be used as degassing holes. In addition, as described above, the second through-holes h2 may reduce volumes of the first and second pads 182a and 182b to reduce the stress (or thermal impact) due to the difference in the coefficient of thermal expansion between the first and second pads 182a and 182b and the insulating layer 141, resulting in effective suppression of peeling of the first and second pads 182a and 182b from the insulating layer 141 or occurrence of the cracks.

As described above, the first and second through-holes h1 and h2 used in the present exemplary embodiment may provide different beneficial functions depending on positions an arrangement forms thereof.

Shapes or structures of the first an second through-holes h1 and h2 used in the present exemplary embodiment may also be variously modified. For example, as illustrated in FIG. 12, the first and second through-holes h1 and h2 may include closed holes h1' and h2' arranged in internal regions of the first and second pads 182a and 182b and surrounded by pad regions and opened holes h1" and h2" arranged along edges of the first and second pads 182a and 182b and partially opened in side surfaces of the first and second pads

182a and 182b, respectively. Particularly, the opened holes h1" of the first through-holes h1 are positioned at the edge of the first and second pads 182a and 182b, as illustrated in FIG. 13, and may thus be more easily filled with the first and second connection metals 175a and 175b in a reflow process.

Meanwhile, the first regions P1 of the first and second pads 182a and 182b may be divided into regions P1a overlapping the first and second external electrodes 195a and 195b from a plan view perpendicular to a stacking direction, and regions P1b, which correspond to regions except the regions P1a, covered with the first and second connection metals 175a and 175b.

The first and second connection vias 183a and 183b used in the present exemplary embodiment may be positioned in the regions P1a overlapping the first and second external electrodes 195a and 195b from a plan view perpendicular to a stacking direction. At these positions of the first and second connection vias 183a and 183b, the first and second connection vias 183a and 183b may connect the first and second external electrodes 195a and 195b to the redistribution layer 142 in the shortest path.

As illustrated in FIG. 12, before the surface mount component 190 is mounted, each of the first and second pads 182a and 182b may be divided into adjacent regions adjacent to each other in relation to a central line L dividing each of the first and second pads 182a and 182b substantially in half and corresponding to a substantially half portion and the other regions corresponding to remaining portions except the adjacent regions. Also in this case, the first and second connection vias 183a and 183b may be represented as being positioned to overlap the adjacent regions of the first and second pads 182a and 182b, respectively.

In addition, as illustrated in FIG. 12, in the regions P1a overlapping the first and second external electrodes 195a and 195b from a plan view perpendicular to a stacking direction, the first through-holes h1 may not be formed in order to ensure stable connection between the pads 182a and 182b and the first and second connection vias 183a and 183b, and the opened holes h1" filled with the first and second connection metals 175a and 175b may be positioned at the edges of the first and second pads 182a and 182b, as described above. In such an arrangement, thermal impact or thermal stress may be concentrated in outer side regions of the first and second pads 182a and 182b, and relatively small thermal impact or thermal stress may be applied to the regions overlapping the first and second external electrodes 195a and 195b from a plan view perpendicular to a stacking direction.

Figure 14A:
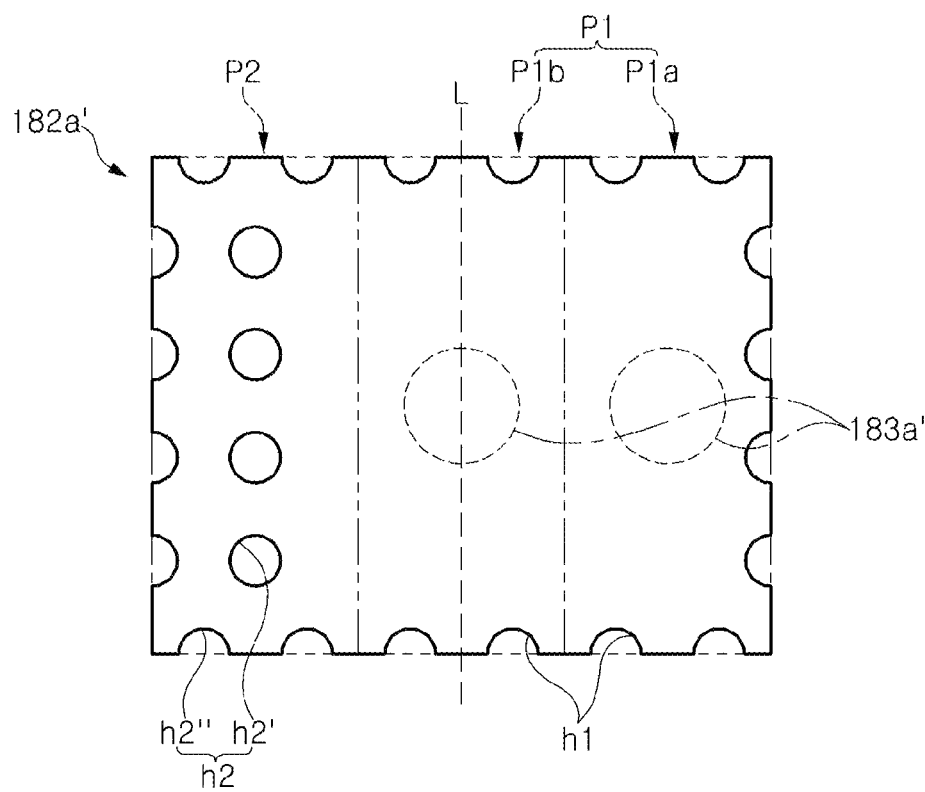
FIGS. 14A and 14B are plan views illustrating various examples of pads that may be used in exemplary embodiments in the present disclosure.
Figure 14B:
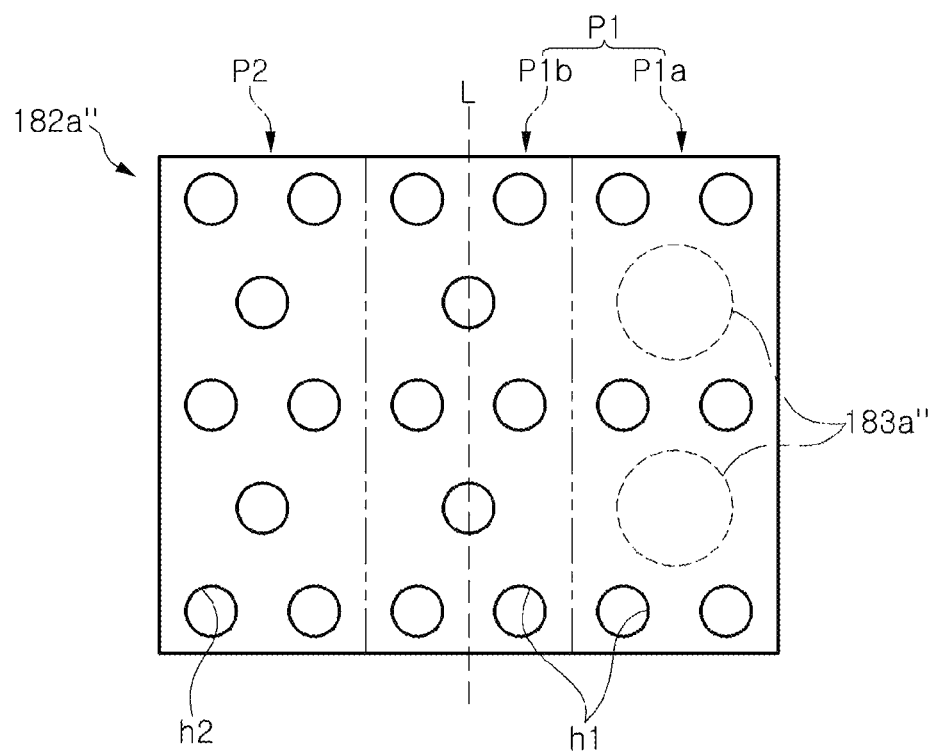

In the first and second pads 182a and 182b used in the present exemplary embodiment, a form in which the opened holes h1" and h2" are formed to surround the entire pads and the closed holes h1' and h2' are provided in only specific regions P1b and P2 is exemplified, but the first and second pads 182a and 182b are not limited thereto, and may have various other arrangements, as illustrated in FIGS. 14 and 14B.

Referring to FIG. 14A, a pad 182a' according to the present modified example may include first through-holes h1 positioned in a first region P1 and second through-holes h2 positioned in a second region P2, similar to the pad 182 according to the previous exemplary embodiment. The second through-holes h2 may include closed holes h2' and opened holes h2" arranged along edges of the pad in an internal region of the pad, but the first through-holes h1 may include only opened holes h1" unlike the pad 182a according to the previous exemplary embodiment. That is, the closed holes h2' may be provided to only the second region P2 in which an external electrode and a connection metal are not positioned. In addition, connection vias 183a' may be arranged in a region P1b in which only the connection metal is positioned as well as a region P1a overlapping the external electrode from a plan view perpendicular to a stacking direction. As described above, the number of connection vias 183a' and positions of the connection vias 183a' may be modified in the first region P1.

Referring to FIG. 14B, a pad 182a" according to the present modified example may include first through-holes h1 positioned in a first region P1 and second through-holes h2 positioned in a second region P2, similar to the pad 182 according to the previous exemplary embodiment. However, both of first second through-holes h1 and h2 may include only closed holes formed in an internal region of the pad. In addition, the first through-holes h1 used in the present modified example may be formed in a region P1a overlapping an external electrode from a plan view perpendicular to a stacking direction, as well as a region P1b in which only a connection metal is positioned. However, in the region P1a overlapping the external electrode, the first through-holes h1 may be appropriately arranged so as not to overlap connection vias 183a". In another exemplary embodiment, both of the first and second through-holes h1 and h2 may include only opened holes arranged along edges of the pad.

In the present exemplary embodiment, the second surface 140B of the connection structure 140 on which the surface mount component 190 is mounted may be provided by the outermost insulating layer of the plurality of insulating layers 141. The outermost insulating layer 141 may perform a passivation function, and have openings opening at least portions of the redistribution layer 142. The underbump metals 160 may be disposed in the openings, respectively, and may be connected to external connection metals 170, respectively. The external connection metals 170 may serve to physically and/or electrically connect the semiconductor package 100 to an external apparatus such as a mainboard of an electronic device. The external connection metal 170 may include a low melting point metal, for example, a solder such as tin (Sn)-aluminum (Al)-copper (Cu), or the like. The external connection metal 170 may be a single layer or multiple layers. For example, the multiple layers may include a copper pillar and a solder, and the single layer may include a tin-silver solder or copper.

A case in which the external connection metal 170 has a ball shape is exemplified, but the electrical external metal 170 may have another structure having a predetermined height, such as a land or a pin. Therefore, a predetermined mounting space may be secured on a lower surface of the insulating layer 141 by a height of the external connection metal 170. In some exemplary embodiments, the outermost insluting layer may include a separate passivation layer having a material different from that of the other insulating layers.

In the present exemplary embodiment, two surface mount components 190 are exemplified for convenience of explanation, but one or a plurality of (three or more) surface mount components may be mounted on the first surface 140A of the connection structure 140 as well as the first surface 140B of the connection structure 140, in a manner similar to the manner described above.

Main components of the semiconductor package 100 according to the present exemplary embodiment will hereinafter be described in more detail.

The frame 110 may improve rigidity of the semiconductor package 100 depending on certain materials, and serve to secure uniformity of a thickness of the encapsulant 130. When wiring layers 112a, 112b, 112c, and 112d, wiring vias 113a, 113b, and 113c, and the like, are formed in the frame 110, the semiconductor package 100 may be utilized as a package-on-package (POP) type package. The frame 110 may have the cavity 110H. The semiconductor chip 120 may be disposed in the cavity 110H to be spaced apart from the frame 110 by a predetermined distance. Side surfaces of the semiconductor chip 120 may be surrounded by the frame 110. However, such a form is only an example and may be variously modified to have other forms, and the frame 110 may perform another function depending on such a form.

The frame 110 may include a first insulating layer 111a in contact with the connection structure 140, a first wiring layer 112a in contact with the connection structure 140 and embedded in the first insulating layer 111a, a second wiring layer 112b disposed on the other surface of the first insulating layer 111a opposing one surface of the first insulating layer 111a in which the first wiring layer 112a is embedded, a second insulating layer 111b disposed on the first insulating layer 111a and covering the second wiring layer 112b, and a third wiring layer 112c disposed on the second insulating layer 111b. The first to third wiring layers 112a, 112b, and 112c may be electrically connected to connection pads 122. The first to third wiring layers 112a, 112b, and 112c may be electrically connected to each other through first and second wiring vias 113a and 113b each penetrating through the first to second insulating layers 111a and 111b.

When the first wiring layer 112a is embedded in the first insulating layer 111a as in the present exemplary embodiment, a step generated due to a thickness of the first wiring layer 112a may be significantly reduced, and an insulating distance of the connection structure 140 may thus become constant. The first wiring layer 112a may be recessed into the first insulating layer 111a, such that a lower surface of the first insulating layer 111a and a lower surface of the first wiring layer 112a may have a step therebetween. In this case, a phenomenon in which a material of an encapsulant 130 bleeds to pollute the first wiring layer 112a may be prevented. The frame 110 may be manufactured at a sufficient thickness by a substrate process, or the like, while the connection structure 140 may be manufactured by a semiconductor process, or the like so as to have a small thickness. Therefore, a thickness of each of the first to third wiring layers 112a, 112b, and 112c of the frame 110 may be greater than that of each of the redistribution layers 142 of the connection structure 140.

A material of each of the first and second insulating layers 111a and 111b may be, for example, a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, Ajinomoto Build-up Film (ABF), FR-4, Bismaleimide Triazine (BT), or the like. In some exemplary embodiments, a photoimagable dielectric (PID) resin may also be used as the material of each of the first and second insulating layers 111a and 111b. In terms of maintenance of rigidity, the prepreg may be used as the material of each of the first and second insulating layers 111a and 111b.

The first to third wiring layers 112a, 112b, and 112c may serve to redistribute the connection pads 122 of the semiconductor chip 120. Each of the first to third wiring layers 112a, 112b, and 112c may include a conductive material such as copper (Cu), aluminum (Al), silver (Ag), tin (Sn), gold (Au), nickel (Ni), lead (Pb), titanium (Ti), or alloys thereof. The first to third wiring layers 112a, 112b, and 112c may perform various functions depending on designs of corresponding layers. For example, the first to third wiring layers 112a, 112b, and 112c may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the first to third wiring layers 112a, 112b, and 112c may include via pads, wire pads, ball pads, and the like.

The first and second wiring vias 113a and 113b may electrically connect the first to third wiring layers 112a, 112b, and 112c formed on different layers to each other to form a wiring structure having an interlayer connection path within the frame 110. A material of each of the first and second wiring vias 113a and 113b may be the conductive material described above. Each of the first and second wiring vias 113a and 113b may be a filled-type via filled with the conductive material, or be a conformal-type via in which the conductive material may be formed along a wall of each of via holes. Meanwhile, depending on a process, the first and second wiring vias 113a and 113b may have tapered shapes of which directions are the same as each other, that is, tapered shapes of which widths of upper portions are greater than those of lower portions, in relation to a cross section. When the first and second wiring vias 113a and 113b are formed by the same plating process, the first and second wiring vias 113a and 113b may be integrated with the second and third wiring layers 112b and 112c.

The semiconductor chip 120 may be an integrated circuit (IC) provided in an amount of several hundred to several million or more elements integrated in a single chip. In this case, the IC may be, for example, a processor chip (more specifically, an application processor (AP)) such as a central processor (for example, a CPU), a graphic processor (for example, a GPU), a field programmable gate array (FPGA), a digital signal processor, a cryptographic processor, a microprocessor, a micro controller, or the like, but is not limited thereto. For example, the IC may be a memory chip such as a volatile memory (for example, a DRAM), a non-volatile memory (for example, a ROM), a flash memory, or the like, a logic chip such as an analog-to-digital converter, an application-specific IC (ASIC), or the like, or another kind of chip such as a power management IC (PMIC), or a combination of some thereof.

The semiconductor chip 120 may be formed on the basis of an active wafer. In this case, a base material of a body 121 may be silicon (Si), germanium (Ge), gallium arsenide (GaAs), or the like. Various circuits may be formed on the body 121. The connection pads 122 may electrically connect the semiconductor chip 120 to other components. A material of each of the connection pads 122 may be a conductive material such as aluminum (Al), copper (Cu), or the like. A passivation layer 123 opening the connection pads 122 may be formed on an active surface of the body 121, and may be an oxide layer, a nitride layer, or the like, or a double layer of an oxide layer and a nitride layer. A lower surface of the connection pad 122 may have a step with respect to a lower surface of the encapsulant 130 through the passivation layer 123. Therefore, the encapsulant 130 may fill at least portions of a space between the passivation layer 123 and the connection structure 140. In this case, a phenomenon in which the encapsulant 130 bleeds into the lower surface of the connection pad 122 may be prevented to some degree. An insulating layer (not illustrated), and the like, may further be disposed in other required positions. The semiconductor chip 120 may be a bare die, and the connection pads 122 may thus be in physical contact with connection vias 143 of the connection structure 140. However, depending on a kind of semiconductor chip 120, a separate redistribution layer (not illustrated) may further be formed on an active surface of the semiconductor chip 120, and bumps (not illustrated), or the like, may be connected to the connection pads 122.

The encapsulant 130 may protect the frame 110, the semiconductor chip 120, and the like. An encapsulation form of the encapsulant 130 is not particularly limited, but may be a form in which the encapsulant 130 surrounds at least portions of each of the frame 110 and the semiconductor chip 120. For example, the encapsulant 130 may cover the frame 110 and an inactive surface (a surface on which the connection pads 122 are not formed) of the semiconductor chip 120, and fill at least portions of the cavity 110H. The encapsulant 130 may fill the cavity 110H to thus serve as an adhesive and reduce buckling of the semiconductor chip 120 depending on certain materials.

A material of the encapsulant 130 may be, for example, a thermosetting resin such as an epoxy resin, a thermoplastic resin such as a polyimide resin, or a resin in which the thermosetting resin or the thermoplastic resin is mixed with an inorganic filler or is impregnated together with an inorganic filler in a core material such as a glass fiber, or the like, but is not limited thereto. In some exemplary embodiments, a material of the encapsulant 130 may be a thermosetting resin such as prepreg, ABF, FR-4, or BT or a photoimagable encapsulant (PIE) resin.

The wiring pattern layer 132 may be formed on the encapsulant 130 and be connected to the wiring structure (particularly, the third wiring layer 112c). The wiring vias 133 may penetrate through at least portions of the encapsulant 130, and may electrically connect the third wiring layer 112c, which is the uppermost wiring layer of the frame 110, and the wiring pattern layer 132 to each other. A material of each of the wiring pattern layer 132 and the wiring via 133 may be the conductive material described above, and be a metal such as copper (Cu) in some exemplary embodiments. In addition, each of the wiring pattern layer 132 and the wiring via 133 may be a plurality of conductor layers including a seed layer and a plating layer. The wiring pattern layer 132 may perform various functions depending on a design. For example, the redistribution layers 142 may include ground patterns, power patterns, signal patterns, and the like. The wiring via 133 may also have a tapered shape of which a width of an upper surface is greater than that of a lower surface, in relation to a cross section.

The connection structure 140 may redistribute the connection pads 122 of the semiconductor chip 120. Several tens to several hundreds of connection pads 122 of the semiconductor chip 120 having various functions may be redistributed by the connection structure 140, and may be physically and/or electrically externally connected through the external connection metals 170 depending on the functions. The connection structure 140 may include insulating layers 141 in contact with the frame 110 and the semiconductor chip 120, the redistribution layers 142 disposed on the insulating layers 141, and the connection vias 143 penetrating through the insulating layers 141 and connecting the connection pads 122 and the redistribution layers 142 to each other. A case in which the connection structures 140 include three insulating layers 141 and three redistribution layers 142 and connection vias 143 is exemplified in FIG. 9, but the connection structure 140 may be implemented as a single layer or two layers or as a larger number of layers than three layers in another exemplary embodiment.

A material of each of the insulating layers 141 may be a photosensitive insulating material such as a PID resin, in addition to the insulating material described above. When the insulating layer 141 has photosensitive properties, the insulating layer 141 may be formed to have a smaller thickness, and a fine pitch of the connection via 143 may be achieved more easily by a photolithography process. In some exemplary embodiments, each of the insulating layers 141 may be a photosensitive insulating layer including an insulating resin and an inorganic filler. When the insulating layers 141 are multiple layers, materials of the insulating layers 141 may be the same as each other, and may also be different from each other, if necessary. Even though the insulating layers 141 are the multiple layers, a boundary between the insulating layers 141 may also not be apparent.

The redistribution layers 142 may serve to substantially redistribute the connection pads 122, and may be formed of the conductive material described above. The redistribution layers 142 may perform various functions depending on designs of corresponding layers. For example, the redistribution layers 142 may include ground patterns, power patterns, signal patterns, and the like. Here, the signal patterns may include various signals except for the ground patterns, the power patterns, and the like, such as data signals, and the like, and may include pad patterns having various shapes, if necessary.

The connection vias 143 may electrically connect the redistribution layers 142 formed on different layers, the connection pads 122, and the like, to each other, and form an electrical path in a vertical direction (interlayer electrical path) within the semiconductor package 100. A material of each of the connection vias 143 may be the conductive material described above. Each of the connection vias 143 may be completely filled with the conductive material or the conductive material may be formed along a wall of each of via holes. Meanwhile, each of the connection vias 143 of the connection structure 140 may have a tapered shape of which a direction is opposite to that of each of the first and second wiring vias 113a and 113b of the frame 110. That is, each of the connection vias 143 of the connection structure 140 may have a tapered shape of which a width of an upper surface is smaller than that of a lower surface, in relation to a cross section.

The passivation layer 150 may protect the connection structure 140 from external physical or chemical damage. The passivation layer 150 may include the insulating material described above. In some exemplary embodiments, the passivation layer 150 may include prepreg, ABF, FR-4, BT, a solder resist, or a PID. The passivation layer 150 may have openings H opening partial regions of the wiring pattern layer 132. A surface treatment layer 132P may be formed in the opened regions of the wiring pattern layer 132 by plating such as noble metal plating. The surface treatment layer 132P may be formed by, for example, electrolytic gold plating, electroless gold plating, organic solderability preservative (OSP) or electroless tin plating, electroless silver plating, electroless nickel plating/substituted gold plating, direct immersion gold (DIG) plating, hot air solder leveling (HASL), or the like, but is not limited thereto.

The underbump metals 160 may be formed in openings of the outermost insulating layer or the passivation layer by any known metallization method using any known conductive material such as a metal, but are not limited thereto. The number, an interval, a disposition form, and the like, of external connection metals 170 are not particularly limited, but may be sufficiently modified depending on design particulars by those skilled in the art. For example, the external connection metals 170 may be provided in an amount of several tens to several thousands according to the number of connection pads 122, or may be provided in an amount of several tens to several thousands or more or several tens to several thousands or less.

At least one of the external connection metals 170 may be disposed in a fan-out region. The fan-out region refers to a region except for a region overlapping the semiconductor chip 120. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be manufactured to have a small thickness, and may have price competitiveness.

Although not illustrated in FIG. 9, a plurality of semiconductor chips 120 performing functions that are the same as or different from each other may be disposed in the cavity 110H. In some exemplary embodiments, a separate passive component such as an inductor, a capacitor, or the like, may be disposed in the cavity 110H. In addition, in some exemplary embodiment, a plurality of cavities 110H may be formed, and semiconductor chips 120 and/or passive components may be disposed in the cavities 110H, respectively. A metal layer may be formed on walls of the cavity 110H, if necessary, in order to dissipate heat and block electromagnetic waves.

Figure 15:
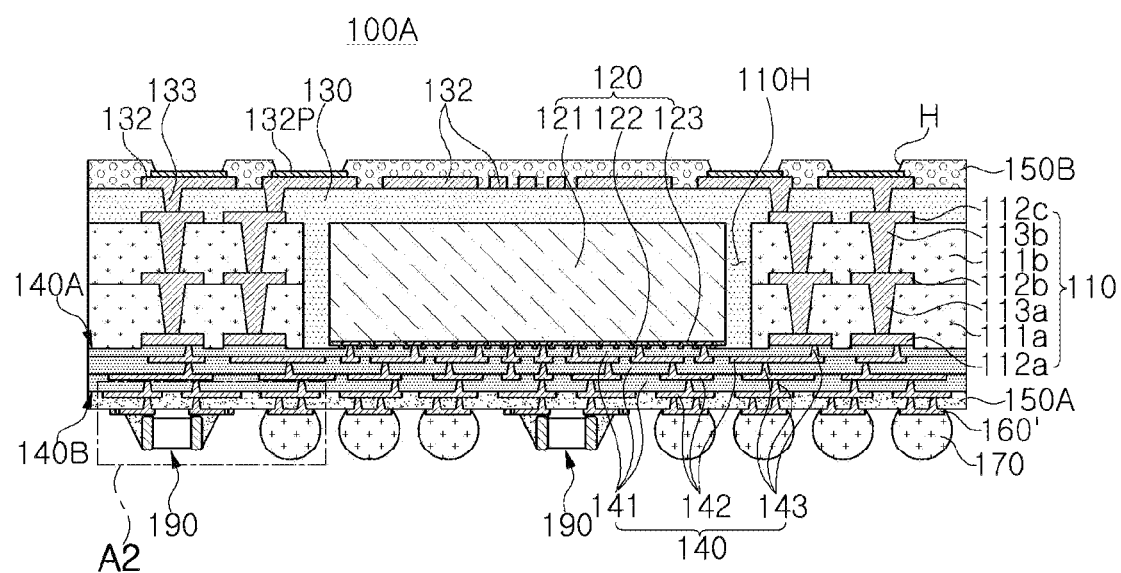
FIG. 15 is a schematic cross-sectional view illustrating a semiconductor package according to another exemplary embodiment in the present disclosure.
Figure 16:
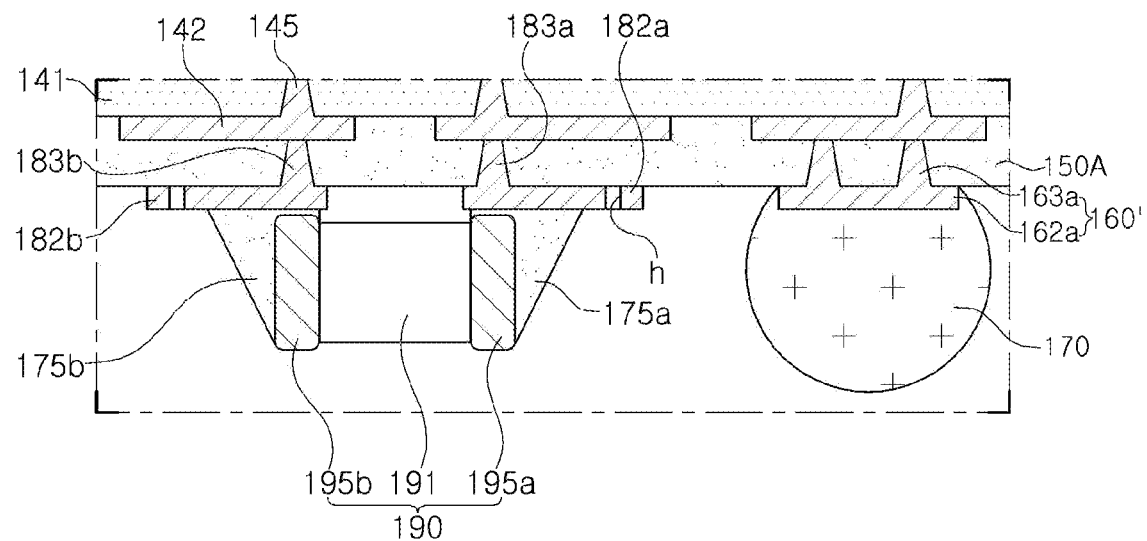
FIG. 16 is an enlarged cross-sectional view of region "A2" of the semiconductor package of FIG. 15.

FIG. 15 is a schematic cross-sectional view illustrating a semiconductor package according to another exemplary embodiment in the present disclosure, and FIG. 16 is an enlarged cross-sectional view of region "A2" of the semiconductor package of FIG. 15.

Referring to FIG. 15, it may be understood that a semiconductor package 100A has a structure similar to that illustrated in FIGS. 9 through 11 except that an additional (or second) passivation layer 150B is used and pads 182a and 182b and connection vias 183a and 183b form underbump metal layers 160' together with each other. Components according to the present exemplary embodiments may be understood with reference to the description for the same or similar components of the semiconductor package 100 illustrated in FIGS. 9 through 13 unless explicitly described otherwise.

The semiconductor package 100A according to the present exemplary embodiment may include a first passivation layer 150A disposed on a second surface 140B of a connection structure 140 and a second passivation layer 150B disposed on an upper surface of the semiconductor package. Underbump metal layers 160' each connected to a redistribution layer 142 may be formed on the first passivation layer 150A. The underbump metal layer 160' may include an underbump metal (UBM) pad 162a and a plurality of UBM vias 163a.

As illustrated in FIG. 15, first and second pads 182a and 182b disposed on the first passivation layer 150A may be connected to the redistribution layer 142 by first and second connection vias 183a and 183b penetrating through the first passivation layer 150A, respectively. The first and second pads 182a and 182b may include through-holes h, and the first and second connection vias 183a and 183b may be positioned in pad regions overlapping external terminals 195a and 195b and/or connection metals 175a and 175b, respectively, from a plan view perpendicular to a stacking direction.

In the present exemplary embodiment, the first and second pads 182a and 182b may have integrated structures with the first and second connection vias 183a and 183b, respectively. In the present specification, a term "integrated structure" does not mean that two components are simply in contact with each other, and refers to a structure in which two components are formed integrally with each other using the same material by the same process. That is, the first pad 182 and the first connection via 183a, and the second pad 182b and the second connection via 183b may be considered to have the "integrated structures" in which they are simultaneously formed by the same plating process (for example, a Cu plating process).

In addition, the first and second pads 182a and 182b and the first and second connection vias 183a and 183b may be formed together with the underbump metal layers 160' by a metallization process for the underbump metal layers 160' by forming the plurality of UBM vias 163a of each underbump metal layer 160' and forming the UBM vias 163a at a small thickness similar to a diameter of each of the first and second connection vias. As described above, the first and second pads 182a and 182b and the first and second connection vias 183a and 183b may include the same metal as that of the UBM layer 160'.

Figure 17:
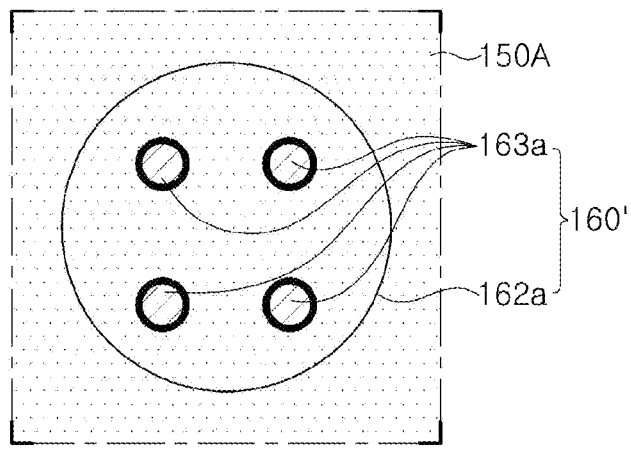
FIG. 17 is a plan view illustrating a structure of an underbump metal (UBM) layer used in the semiconductor package of FIG. 15.

Referring to FIG. 17, a plane structure of the underbump metal 160' used in the present exemplary embodiment is illustrated. Four UBM vias 163a connected to the redistribution layer 142 may be arranged on a UBM pad 162a formed on the second passivation layer 150B. In this via arrangement, even though a diameter of each of individual UBM vias 163a is reduced, a sufficient connection area may be secured, and stress may be dispersed through a plurality of UBM vias 163a to improve board level reliability of the semiconductor package 100A.

In the exemplary embodiment described above, a form in which the surface mount component is mounted on the second surface (a surface on which the external connection metals are formed) of the connection structure is exemplified, but in another exemplary embodiment, the surface mount component may be mounted on the first surface (a mounting surface of the semiconductor chip) of the connection structure.

Figure 18:
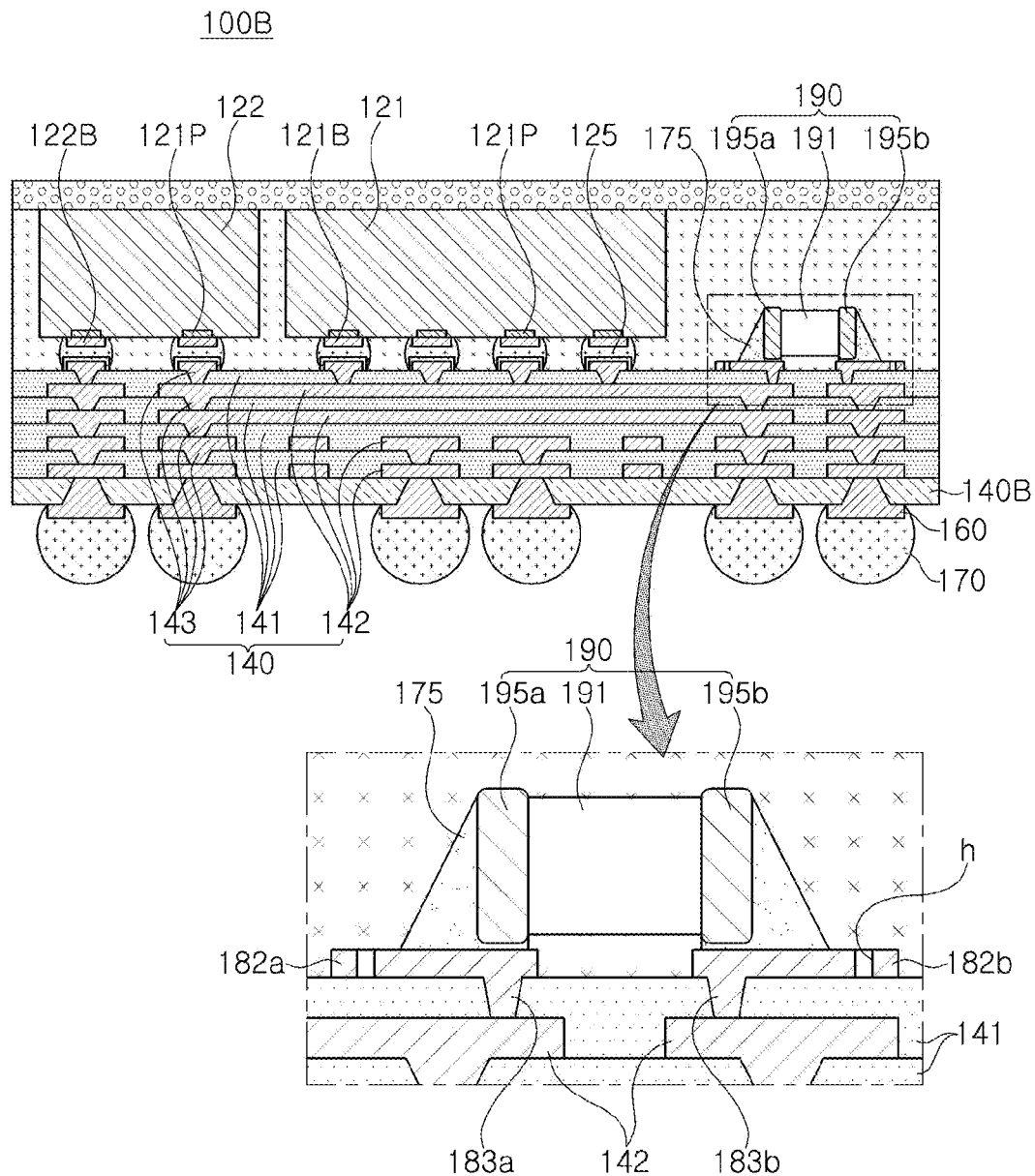
FIGS. 18 through 20 are schematic cross-sectional views illustrating semiconductor packages according to various exemplary embodiments in the present disclosure.

FIG. 18 is a schematic cross-sectional view illustrating a semiconductor package according to another exemplary embodiment in the present disclosure.

Referring to FIG. 18, a semiconductor package 100B according to the present exemplary embodiment may include a connection structure 140 including insulating layers 141, redistribution layers 142 formed on the insulating layers 141, and vias 143, first and second semiconductor chips 121 and 122 disposed on a first surface 140A of the connection structure 140 and having connection pads 121P and 122P connected to the redistribution layer 142, a surface mount component 190 disposed on the first surface 140A of the connection structure 140 and having first and second external electrodes 195a and 195b connected to first and second pads 182a and 182b, respectively, and an encapsulant 130 disposed on the first surface 140A of the connection structure 140 and encapsulating the first and second semiconductor chips 121 and 122.

The connection pads 121P and 122P of the first and second semiconductor chips may be connected to the redistribution layer 142 through bumps 121B and 122B formed on the first surface 140A of the connection structure 140. Each of the bumps 121B and 122B may be formed of a low melting point metal or a solder. An underfill (not illustrated)

may be disposed between the first and second semiconductor chips 121 and 122 and the first surface 140A of the connection structure 140.

Components according to the present exemplary embodiments may be understood with reference to the description for the same or similar components of the semiconductor package 100 illustrated in FIGS. 9 through 13 unless explicitly described otherwise.

However, it may be understood that the semiconductor package 100B according to the present exemplary embodiment is formed by a process different from those of the semiconductor packages 100 and 100A according to the previous exemplary embodiments. In detail, a process of manufacturing the semiconductor package 100B according to the present exemplary embodiment may be performed by mounting the first and second semiconductor chips 121 and 122 after forming the connection structure 140 in advance, unlike the previous exemplary embodiments.

In addition, it may be understood that the connection structure 140 used in the present exemplary embodiment is formed in a direction different from that of the connection structure 140 used in the previous exemplary embodiment by a process different from that used in the previous exemplary embodiments from the redistribution layers 142 and the vias 143 formed in the connection structure 140, particularly, a tapered direction of each of the vias 143. In detail, it may be understood that the redistribution layers 142 and the vias 143 are sequentially formed from the second surface 140B toward the first surface 140A in the connection structure 140 used in the present exemplary embodiment.

In the present exemplary embodiment, the surface mount component 190 may be mounted on the first surface 140A of the connection structure 140. The first and second pads 182*a* and 182*b* disposed on the insulating layer 141 providing the first surface 140A of the connection structure 140 may be connected to the redistribution layer 142 by first and second connection vias 183*a* and 183*b* penetrating through the second passivation layer 150B, respectively. The first and second pads 182*a* and 182*b* may include through-holes h, and the first and second connection vias 183*a* and 183*b* may be positioned in pad regions overlapping first and second external terminals 195*a* and 195*b* and/or first and second connection metals 175*a* and 175*b*, respectively, from a plan view perpendicular to a stacking direction.

By adopting such a structure, volumes of the pads may be reduced to reduce stress due to a difference in a coefficient of thermal expansion between the pads and the insulating layer and ensure stable electrical connection between the surface mount component 190 and the redistribution layer 142 through the shortest path (for example, noise reduction).

Figure 19:
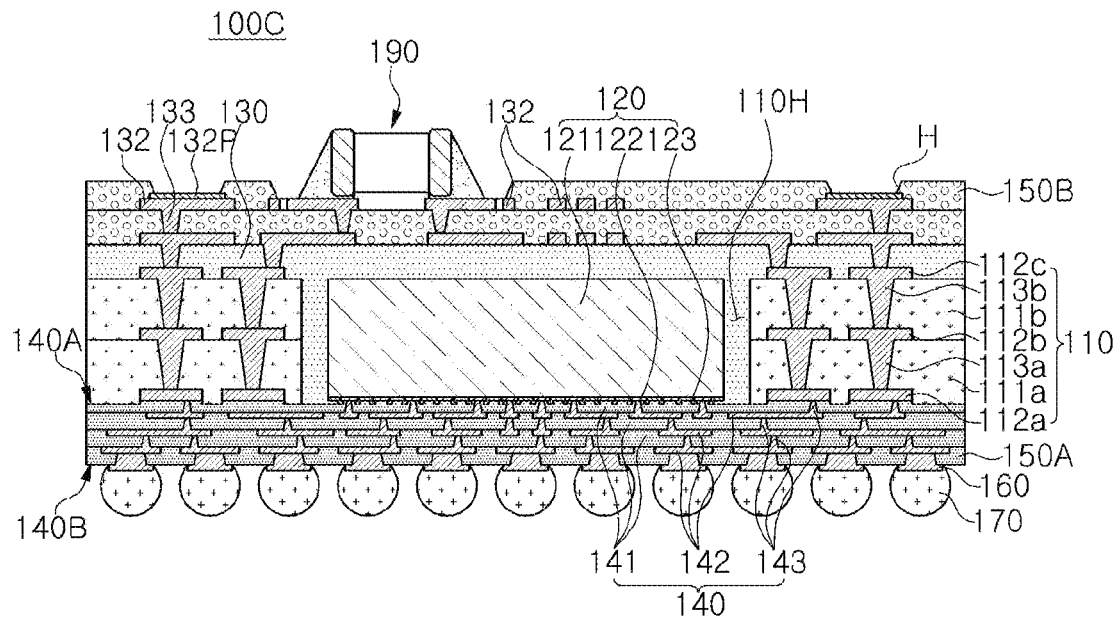
Figure 20:
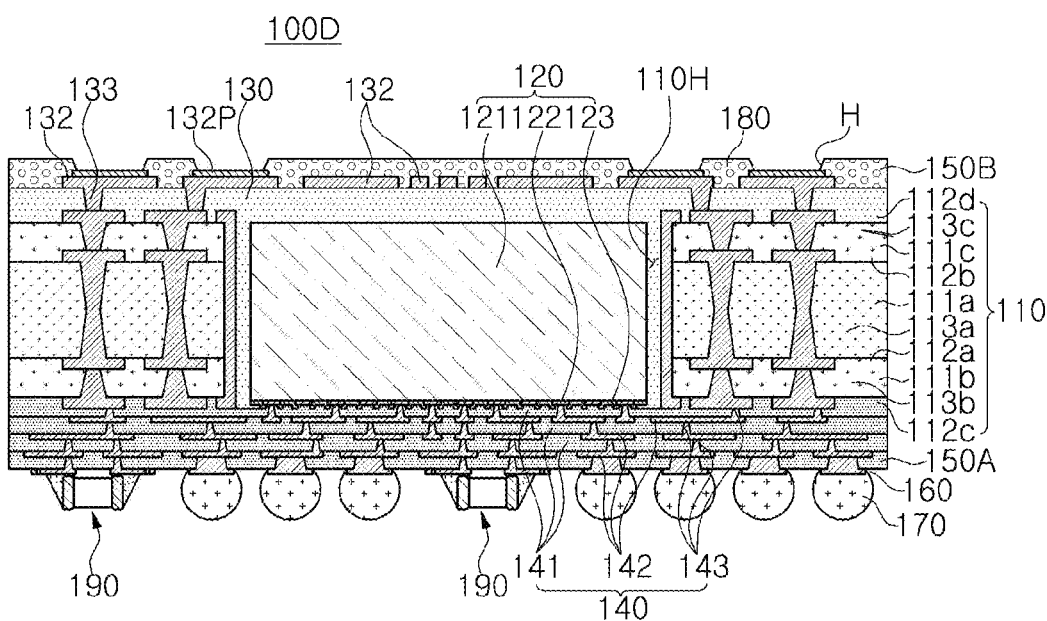

FIGS. 19 and 20 are schematic cross-sectional views illustrating semiconductor packages according to various exemplary embodiments in the present disclosure.

Referring to FIG. 19, it may be understood that a semiconductor package 100C according to the present exemplar embodiment has a structure similar to that illustrated in FIGS. 9 through 13 or FIG. 15 except that additional redistribution structures 132 and 133 are introduced on an encapsulant 130 and a surface mount component 190 is mounted on an upper surface of the semiconductor package 100C instead of a second surface 140B of a connection structure 140. Components according to the present exemplary embodiments may be understood with reference to the description for the same or similar components of the semiconductor packages 100 and 100A illustrated in FIGS. 9 through 13 and FIG. 15 explicitly described otherwise.

The semiconductor package according to the present exemplary embodiment may include a wiring pattern layer 132 and wiring vias 133 implemented on an insulating layer 131 disposed on the encapsulant. As illustrated in FIG. 19, the surface mount component 190 may be disposed on the upper surface of the semiconductor package 100C. First and second pads 182*a* and 182*b* may be disposed on the insulating layer 131, and may be opened by openings of a second passivation layer 150B. The first and second pads 182*a* and 182*b* may be connected to the wiring pattern layer 132 by first and second connection vias 183*a* and 183*b* penetrating through the insulating layer 131, respectively. The first and second pads 182*a* and 182*b* may include through-holes h, and the first and second connection vias 183*a* and 183*b* may be positioned in pad regions overlapping first and second external terminals 195*a* and 195*b* and/or first and second connection metals 175*a* and 175*b*, respectively, from a plan view perpendicular to a stacking direction. The semiconductor package may further include an additional surface mount component 190 disposed on the second surface 140B of the connection structure 140.

Referring to FIG. 20, it may be understood that a semiconductor package 100D according to the present exemplary embodiment has a structure similar to that illustrated in FIGS. 9 through 13 and FIG. 15 except for a form of a wiring structure of a frame 110. Components according to the present exemplary embodiments may be understood with reference to the description for the same or similar components of the semiconductor packages 100 and 100A illustrated in FIGS. 9 through 13 and FIG. 15 explicitly described otherwise.

A frame 110 used in the present exemplary embodiment may have a structure different from that of the frame 110 described above, and a wiring structure of the frame 110 may thus be modified. In detail, the frame 110 may include a first insulating layer 111*a*, a first wiring layer 112*a* disposed on one surface of the first insulating layer 111*a*, a second wiring layer 112*b* disposed on the other surface of the first insulating layer 111*a*, a second insulating layer 111*b* disposed on one surface of the first insulating layer 111*a* and covering at least portions of the first wiring layer 112*a*, a third wiring layer 112*c* disposed on the other surface of the second insulating layer 111*b* opposing one surface of the second insulating layer 111*b* in which the first wiring layer 112*a* is embedded, a third insulating layer 111*c* disposed on the outer surface of the first insulating layer 111*a* and covering at least portions of the second wiring layer 112*b*, a fourth wiring layer 112*d* disposed on the other surface of the third insulating layer 111*c* opposing one surface of the third insulating layer 111*c* in which the second wiring layer 112*b* is embedded, first wiring vias 113*a* penetrating through the first insulating layer 111*a* and electrically connecting the first and second wiring layers 112*a* and 112*b* to each other, second wiring vias 113*b* penetrating through the second insulating layer 111*b* and electrically connecting the first and third wiring layers 112*a* and 112*c* to each other, and third wiring vias 113*c* penetrating through the third insulating layer 111*c* and electrically connecting the second and fourth wiring layers 112*b* and 112*d* to each other. Since the frame 110 used in the present exemplary embodiment has a larger number of wiring layers 112*a*, 112*b*, 112*c*, and 112*d*, redistribution layers 142 of a connection structure 140 may further be simplified.

The first insulating layer 111*a* may have a thickness greater than those of the second insulating layer 111*b* and the third insulating layer 111*c*. The first insulating layer 111*a* may be basically relatively thick in order to maintain rigidity, and the second insulating layer 111b and the third insulating layer 111c may be introduced in order to form a larger number of wiring layers 112c and 112d. The first insulating layer 111a may include an insulating material different from those of the second insulating layer 111b and the third insulating layer 111c. For example, the first insulating layer 111a may be, for example, prepreg including a core material such as a glass fiber, an inorganic filler, and an insulating resin, and the second insulating layer 111b and the third insulating layer 111c may be an ABF or a PID including an inorganic filler and an insulating resin. However, the materials of the first insulating layer 111a and the second and third insulating layers 111b and 111c are not limited thereto. Similarly, the first wiring vias 113a penetrating through the first insulating layer 111a may have a diameter greater than those of the second and third wiring vias 113b and 113c each penetrating through the second and third insulating layers 111b and 111c. In addition, the first wiring via 113a may have an hourglass shape or a cylindrical shape, while the second and third wiring vias 113b and 113c may have tapered shapes of which directions are opposite to each other. Thicknesses of the first to fourth wiring layers 112a, 112b, 112c, and 112d may be greater than those of the redistribution layers 142.

In the present disclosure, examples of the semiconductor packages in which the surface mount component is mounted are disclosed, but unique features of the present disclosure are that the semiconductor package includes the first and second pads having the through-holes and the first and second connection vias connected to the first and second pads, respectively, in a state in which the surface mount component is not mounted, and the spirit and scope of the present disclosure may thus be considered to include another board as well as a semiconductor package in which the surface mount component is not mounted.

In this case, as illustrated in FIGS. 12, 14A and 14B, before the surface mount component 190 is mounted, each of the first and second pads 182a and 182b may be divided into adjacent regions adjacent to each other in relation to the central line L dividing substantially a half thereof and corresponding to a substantially half portion and the other regions corresponding to remaining portions except the adjacent regions, and the first and second connection vias 183a and 183b may be represented as being positioned to overlap the adjacent regions of the first and second pads 182a and 182b, respectively, from a plan view perpendicular to a stacking direction.

As set forth above, according to an exemplary embodiment in the present disclosure, a plurality of through-holes may be formed in pads on which a surface mount (SMT) component is to be mounted, and connection vias may be positioned in regions of the pads overlapping a mounting region of the surface mount component to reduce volumes of the pads, such that stress due to a difference in a coefficient of thermal expansion between the pads and an insulating layer may be reduced and more reliable electrical connection between the surface mount component and an internal circuit (for example, a redistribution layer) may be ensured.

While exemplary embodiments have been shown and described above, it will be apparent to those skilled in the art that modifications and variations could be made without departing from the scope of the present invention as defined by the appended claims.

What is claimed is:
1. A semiconductor package comprising:
 a connection structure including a first surface and a second surface opposing each other and including a plurality of insulating layers and redistribution layers respectively disposed on the plurality of insulating layers;
 a semiconductor chip disposed on the first surface of the connection structure and having connection pads connected to the redistribution layer;
 an encapsulant disposed on the first surface of the connection structure and encapsulating the semiconductor chip;
 first and second pads arranged on at least one surface of the connection structure and each having a plurality of through-holes;
 a surface mount component disposed on the at least one surface of the connection structure and including first and second external electrodes positioned, respectively, in portions of the first and second pads;
 first and second connection vias arranged in the plurality of insulating layers and connecting the first and second pads to the redistribution layers, respectively; and
 first and second connection metals connecting the first and second pads and the first and second external electrodes to each other, respectively,
 wherein the first and second pads include first regions covered with the first and second external electrodes and the first and second connection metals, respectively, and second regions corresponding to remaining portions except the first regions, and
 wherein the plurality of through-holes include first through-holes positioned in the first regions and having at least parts of the first and second connection metals therein, and second through-holes positioned in the second regions and having empty internal spaces.

2. The semiconductor package of claim 1, wherein the first through-holes include a plurality of opened through-holes arranged along edges of the first and second pads and partially opened to side surfaces of the first and second pads.

3. The semiconductor package of claim 1, wherein each of the first and second connection vias includes a plurality of connection vias.

4. The semiconductor package of claim 3, wherein the plurality of connection vias include connection vias positioned in regions overlapping the first and second connection metals from a plan view perpendicular to a stacking direction.

5. The semiconductor package of claim 1, wherein
 the first through-holes are positioned along edges of the first regions and partially opened to side surfaces of the first and second pads, and the second through-holes expose surfaces of the plurality of insulating layers.

6. The semiconductor package of claim 1, further comprising a frame disposed on the first surface of the connection structure and having a cavity in which the semiconductor chip is disposed.

7. The semiconductor package of claim 6, wherein the frame includes a wiring structure penetrating through upper and lower surfaces thereof and connected to the redistribution layers.

8. The semiconductor package of claim 7, further comprising a wiring pattern layer disposed on the encapsulant and connected to the wiring structure.

9. The semiconductor package of claim 1, wherein the first and second connection vias are respectively arranged to overlap the first and second external electrodes from a plan view perpendicular to a stacking direction.

10. A semiconductor package comprising:
 a connection structure including a first surface and a second surface opposing each other and including a plurality of insulating layers and redistribution layers respectively disposed on the plurality of insulating layers;

a semiconductor chip disposed on the first surface of the connection structure and having connection pads connected to the redistribution layer;

an encapsulant disposed on the first surface of the connection structure and encapsulating the semiconductor chip;

first and second pads adjacent to each other and arranged on the second surface of the connection structure, each having a plurality of through-holes; and first and second connection vias arranged in the plurality of insulating layers and connecting the first and second pads to the redistribution layers, respectively, wherein the first and second pads respectively include first regions corresponding to portions adjacent to each other and second regions corresponding to remaining portions except the first regions, and the first and second connection vias are positioned to overlap with the first regions of the first and second pads, respectively, from a plan view perpendicular to a stacking direction.

11. The semiconductor package of claim 10, further comprising:
a surface mount component disposed on the second surface of the connection structure and including first and second external electrodes positioned, respectively, in the first regions of the first and second pads; and first and second connection metals connecting the first and second pads and the first and second external electrodes to each other, respectively.

12. The semiconductor package of claim 10, wherein the plurality of through-holes are arranged so as not to overlap the first and second connection vias from the plan view perpendicular to the stacking direction.

13. The semiconductor package of claim 10, wherein the first and second pads have integrated structures with the first and second connection vias, respectively.

14. The semiconductor package of claim 13, further comprising underbump metal (UBM) layers disposed on the second surface of the connection structure and connected to the redistribution layers,
wherein the integrated structures include a same metal as a metal included in the UBM layers.

15. A board assembly comprising:
a circuit board including a plurality of insulating layers and wiring circuits respectively disposed on the plurality of insulating layers;

first and second pads arranged on an upper surface of the circuit board and each having a plurality of through-holes;

a surface mount component disposed on the upper surface of the circuit board and including first and second external electrodes positioned, respectively, in regions of the first and second pads;

first and second connection vias disposed in the plurality of insulating layers, arranged in regions overlapping the first and second external electrodes, respectively, from a plan view perpendicular to a stacking direction, and respectively connecting the first and second pads to the wiring circuits; and first and second connection metals connecting the first and second pads and the first and second external electrodes to each other, respectively, wherein the first and second pads include first regions covered with the first and second external electrodes and the first and second connection metals, respectively, and second regions corresponding to remaining portions except the first regions, and wherein the plurality of through-holes include a plurality of opened through-holes arranged along edges of the first regions and partially opened to side surfaces of the first and second pads, and a plurality of closed through-holes positioned in the second regions and exposing surfaces of the plurality of insulating layers, respectively.

* * * * *